United States Patent
Huang et al.

(10) Patent No.: US 12,265,189 B2
(45) Date of Patent: Apr. 1, 2025

(54) PEROVSKITE THICK FILM, PREPARATION METHOD THEREOF, AND RADIATION DETECTOR COMPRISING THE SAME

(71) Applicant: Industrial Technology Research Institute, Hsinchu (TW)

(72) Inventors: Kuo-Wei Huang, Hsinchu (TW); Jen-An Chen, Hsinchu (TW); Yung-Liang Tung, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 224 days.

(21) Appl. No.: 18/148,092

(22) Filed: Dec. 29, 2022

(65) Prior Publication Data

US 2024/0192387 A1 Jun. 13, 2024

(30) Foreign Application Priority Data

Dec. 8, 2022 (TW) .................................. 111147240

(51) Int. Cl.
    *G01T 1/20*     (2006.01)
    *C23C 18/12*     (2006.01)

(52) U.S. Cl.
    CPC ........ *G01T 1/2018* (2013.01); *C23C 18/1204* (2013.01); *C23C 18/1283* (2013.01); *C23C 18/1295* (2013.01)

(58) Field of Classification Search
    CPC .............. G01T 1/2018; C23C 18/1204; C23C 18/1283; C23C 18/1295
See application file for complete search history.

(56) References Cited

U.S. PATENT DOCUMENTS

| | | | |
|---|---|---|---|
| 10,573,690 | B2 | 2/2020 | Lifka et al. |
| 10,903,252 | B2 | 1/2021 | Kim |
| 2019/0140181 | A1 | 5/2019 | Huang et al. |
| 2020/0090876 | A1* | 3/2020 | Zhu .................... H01G 9/008 |

(Continued)

FOREIGN PATENT DOCUMENTS

| | | |
|---|---|---|
| CN | 112106219 | 12/2020 |
| CN | 112313543 | 2/2021 |
| CN | 112582546 | 3/2021 |

(Continued)

OTHER PUBLICATIONS

Tzu-Sen Su et al., "Crown Ether Modulation Enables over 23% Efficient Formamidinium-Based Perovskite Solar Cells", Journal of the American Chemical Society, 2020, 142, pp. 19980-19991, Cited in corresponding Taiwanese Office Action.

(Continued)

*Primary Examiner* — Dani Fox
*Assistant Examiner* — Fani Polyzos Boosalis
(74) *Attorney, Agent, or Firm* — HSML P. C.

(57) ABSTRACT

The present disclosure provides a radiation detector, including a substrate, a pixel array formed on the substrate, a perovskite thick film formed on the pixel array and having a cubic crystal phase, a first electrode formed on the perovskite thick film and is opposite to the pixel array, and a readout circuit. The radiation detector has significantly reduced dark current density and high sensing sensitivity. The present disclosure also provides a method for preparing the perovskite thick film.

24 Claims, 34 Drawing Sheets

(56) References Cited

U.S. PATENT DOCUMENTS

2021/0023985 A1    1/2021  Stadnyk

FOREIGN PATENT DOCUMENTS

| CN | 113644206 | | 11/2021 | | |
|---|---|---|---|---|---|
| CN | 109912458 B | | 1/2022 | | |
| JP | 20200167325 A | * | 10/2020 | ............ | H01L 51/48 |
| KR | 10-1839691 B | | 4/2018 | | |
| TW | 202203444 A | | 1/2022 | | |
| TW | I765376 B | | 5/2022 | | |

OTHER PUBLICATIONS

Qian, et al., "An aerosol-liquid-solid process for the general synthesis of halide perovskite thick films for direct- conversion X-ray detectors", Matter 4, 942-954, Mar. 3, 2021.

Xu, et al., "Sequential Growth of 2D/3D Double-Layer Perovskite Films with Superior X-Ray Detection Performance", Advanced Science, 2021, 8, 2102730—12 pages.

Wang, et al., Electronic-Grade High-Quality Perovskite Single Crystals by a Steady Self-Supply Solution Growth for High-Performance X-ray Detectors, Advanced Materials, 2020, 2001540—10 pages.

\* cited by examiner

PEROVSKITE THICK FILM, PREPARATION METHOD THEREOF, AND RADIATION DETECTOR COMPRISING THE SAME

CROSS-REFERENCE TO RELATED APPLICATIONS

This application claims priority to Taiwan Application Serial No. 111147240, filed on Dec. 8, 2022. The entirety of the application is hereby incorporated by reference herein and made a part of this application.

BACKGROUND

1. Technical Field

The present disclosure relates to a perovskite thick film, the preparation method thereof and a radiation detector comprising the perovskite thick film. The radiation detector of the present disclosure has low dark current density and high sensitivity.

2. Description of Related Art

X-ray detectors comprise many important applications in the fields of medical imaging, security monitoring, and material analysis. An ideal X-ray detector should have high sensitivity, low detection limit, fast response speed, low dark current density, etc.

In previous studies, it has been found that perovskite materials have unique characteristics such as a large X-ray absorption coefficient and a large product (about $10^{-2}$ $cm^2V^{-1}$) of charge carrier mobility and lifetime, and are considered to have potential as a new type of X-ray. However, how to simultaneously achieve high sensitivity, low detection limit, and low dark current density in perovskite X-ray detectors has not been studied in detail. Moreover, perovskite needs a sufficient thickness to absorb X-rays fully due to the strong penetrability of X-rays, whereas the thickness of perovskite films made by conventional methods such as spin coating is usually less than 1 μm, not enough to achieve effective absorption of X-rays. In addition, using perovskite as the X-ray sensing film may achieve high sensitivity, which indicates that data can be obtained at a low dose, thereby reducing exposure dosage for humans.

SUMMARY

An embodiment herein provides a radiation detector, comprising: a substrate; a pixel array formed on the substrate; a perovskite thick film with a cubic crystal phase formed on the pixel array; a first electrode formed on the perovskite thick film and is opposite to the pixel array; and a readout circuit, wherein the perovskite thick film is formed by a perovskite having a chemical formula $ABX_3$, A is a monovalent cation selected from a group consisting of substituted or unsubstituted ammonium ions, substituted or unsubstituted amidine ions, $Cs^+$, $Rb^+$, $Li^+$ and $Na^+$; B is a divalent cation selected from a group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$; and X is a monovalent anion each independently selected from a group consisting of $F^-$, $Cl^-$, $Br^-$, $I^-$, $SCN^-$ and $OCN^-$, wherein the perovskite film comprises a crown ether compound, and the crown ether compound is at least one selected from a group consisting of 12-crown-4, 15-crown-5, 18-crown-6, 21-crown-7, 24-crown-8 and 30-crown-10.

An embodiment herein also provides a method for preparing a perovskite thick film, comprising: a) providing a perovskite precursor solution; b) spraying the perovskite precursor solution on a substrate, and heating the substrate to form a perovskite film; c) repeating the step b) to form a perovskite thick film; d) surface treating the perovskite thick film with a surface treatment solvent having the same composition as the solvent in the perovskite precursor solution; e) annealing the perovskite thick film; and f) slowly cooling the perovskite thick films.

DETAILED DESCRIPTION

Figure 1B:
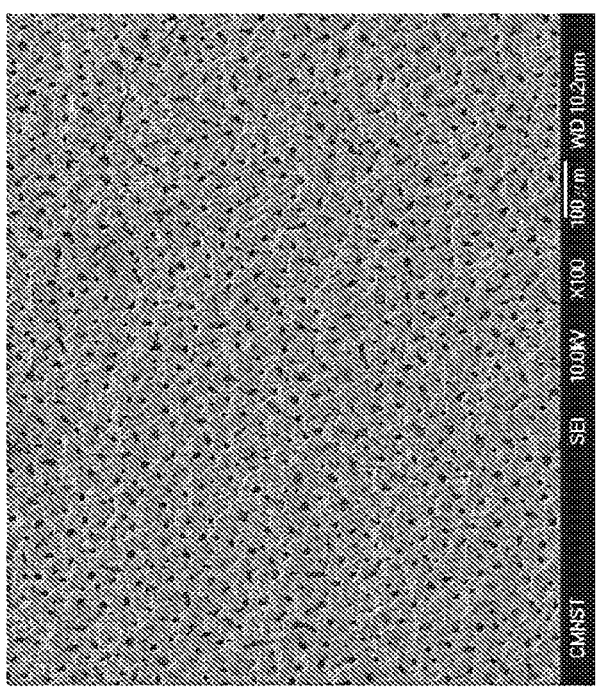
FIGS. 1A and 1B are the scanning electron microscope (SEM) images of the perovskite thick film without a slow cooling treatment in Example 1.

In the following detailed description for the purpose of explanation, numerous specific details are set forth in order to provide a through understanding of the disclose embodiments. It will be apparent, however, that one or more embodiments may be practiced without these details. The embodiments described herein are not intended to limit the present disclosure, and the listed technical features or solutions can be combined with each other. The disclosed embodiments can also be implemented or applied through other different implementations. The details can also be changed or modified according to different viewpoints and applications without departing from the disclosed embodiments.

When "include(s)", "contain(s)" or "have (has)" a particular element as described herein, unless otherwise specified, other elements, components, structures, areas, parts, devices, systems, steps, or connections may be included in addition to, but not excluded from, such other elements.

Unless otherwise clearly stated herein, the singular forms "a" and "the" described herein also include plural forms, and "or" and "and/or" described herein can be used interchangeably. The numerical ranges described herein are inclusive and can be combined, and any numerical values falling within the numerical ranges described herein can be used as the maximum value or the minimum value to derive the second range; for example, "100 seconds to less than The value range of 350 seconds" should be understood as including any sub-range between the minimum value of 100 seconds and the maximum value of less than 350 seconds, for example: 150 seconds to 349.5 seconds, 100 seconds to 300 seconds, and 150 seconds to 300 seconds In addition, if a value falls within the ranges described herein (for example, 200 seconds falls between 100 seconds and less than 350 seconds), then the value is considered to be included in the disclosed embodiments.

The perovskite film made herein is a thick perovskite film with a cubic crystal phase, wherein the surface of the thick perovskite film is flat, uniform, and has a large grain size. Therefore, the radiation detector comprising the thick perovskite film contains the significant capability to exhibit low dark current density and high sensitivity.

One embodiment provides a method for preparing a perovskite thick film, including:
  a) providing a perovskite precursor solution; b) spraying the perovskite precursor solution on a substrate and heating the substrate to form a perovskite film; c) repeating the step b) to form a perovskite thick film d) surface treating the perovskite thick film with a surface treatment solvent having the same composition as the solvent in the perovskite precursor solution; e) annealing the perovskite thick film; and f) slowly cooling the perovskite thick film.

In some embodiments, the perovskite precursor solution comprises a perovskite precursor salt, a crown ether compound, and a solvent. A compound of the chemical formula AX and a compound of the chemical formula $BX'_2$ can be used as the perovskite precursor salt. Specifically, A is a monovalent cation selected from a group consisting of substituted or unsubstituted ammonium ions, substituted or unsubstituted amidine ions, $Cs^+$, $Rb^+$, $Li^+$ and $Na^+$; B is a divalent cation selected from a group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$; X and X' are monovalent anions each independently selected from a group consisting of $F^-$, $Cl^-$, $Br^-$, $I^-$, $SCN^-$ and $OCN^-$.

In some embodiments, A can be formamidine (MA) or Cs; B can be Pb; X and X' can each independently be $Br^-$ or $I^-$.

In some embodiments, the perovskite formed by the perovskite precursor solution is $CsPbBr_3$, $CsPbI_3$, $MAPbBr_3$ or $MAPbI_3$.

In some embodiments, the crown ether compounds can be at least one selected from a group consisting of 12-crown-4, 15-crown-5, 18-crown-6, 21-crown-7, 24-crown-8 and 30-crown-10.

The crown ether compound can firstly be coupled with the perovskite precursor to effectively reduce the agglomeration in the precursor composition; during the film formation process of the perovskite film, the crown ether compound also helps to make nucleation sites disperse to achieve uniform nucleation, thereby optimizing the crystal lattice arrangement. At the same time, the crown ether compound can also assist crystal grains to grow uniformly, and to form crystal grains with high uniformity and high crystallinity in the crystal structure.

In some embodiments, the solvent and the surface treatment solvent can be at least one selected from a group consisting of dimethylsulfoxide (DMSO), N—N dimethylformamide (DMF), γ-butyrolactone (GBL), and N,N-dimethylacetamide (DMAC).

In some embodiments, the solvent and the surface treatment solvent are mixed solvents, namely they are at least two selected from a group consisting of dimethylsulfoxide (DMSO), N—N dimethylformamide (DMF), γ-butyrolactone (GBL), and N,N-dimethylacetamide (DMAC).

In some embodiments, the mixed solvent is both dimethylsulfoxide (DMSO) and γ-butyrolactone (GBL) or both N,N-dimethylacetamide (DMAC) and γ-butyrolactone (GBL), wherein the proportion of γ-butyrolactone (GBL) is 70% to 85%, for example, γ-butyrolactone (GBL) is 70%, 75%, 80%, or 85%, and dimethylsulfoxide (DMSO) or N,N-dimethylacetamide (DMAC) is 30%, 25%, 20%, or 15%.

In some embodiments, the solvent is a mixed solvent of γ-butyrolactone and dimethylsulfoxide (DMSO), and the volume ratio of the two is 70:30 to 85:15. In some embodiments, the surface treatment solvent is a mixed solvent of γ-butyrolactone and dimethylsulfoxide (DMSO), and the volume ratio of the two is 70:30 to 85:15.

In some embodiments, the content of the crown ether compound in the perovskite precursor solution is 0.01 to 0.02 wt %, such as 0.01, 0.011, 0.012, 0.013, 0.014, 0.015, 0.016, 0.017, 0.018, 0.019 and 0.02 wt %.

In some embodiments, the heating of the substrate in the step b) and step c) is carried out in a staged heating manner. For example, because of the repetition of the step b), the substrate is first heated to a first temperature lower than the predetermined temperature in the previous stage, and then the substrate is heated from the first temperature to the predetermined temperature in the latter stage. For example, in the case where the predetermined temperature is 160° C., the substrate is first heated to a temperature lower than 160° C. in the previous stage, such as 159, 158, 157, 156, 155, 154, 153, 152, 151, 150, 149, 148, 147, 146, and 145° C., and then the substrate is heated to 160° C. in the latter stage. The staged heating may comprise two, three, four, five or more stages.

In some embodiments, in the step b), the nozzle will start spraying from an initial position and then moves around, spraying the perovskite precursor solution everywhere on the substrate. After that, the nozzle will return to the initial position and spray perovskite precursor solution again to accomplish the repeated spraying of the step c), thereby preparing a perovskite thick film. The disclosed embodiments controls the time difference (ΔT) of the repeated spraying at the same location to optimize the thick perovskite film. In a specific embodiment, the time difference (ΔT) of the repeated spraying at the same position in the step c) is 100 seconds to less than 350 seconds. In a specific embodiment, the time difference (ΔT) of the repeated spraying at the same position in the step c) is 150 seconds to 300 seconds. For example, the time difference (ΔT) of the repeated spraying at the same position can be 100, 125, 150, 175, 200, 225, 250, 275, 300, 325, 340 or 345 seconds.

In some embodiments, in the step d), surface treat the perovskite thick film with a surface treatment solvent having the same composition as the solvent in the perovskite precursor solution, and this step refers to the addition of a surface treatment solvent to the surface of the perovskite thick film to carry out the Ostwald ripening effect. For example, in the case where the solvent of the perovskite precursor solution is a mixed solvent of dimethylsulfoxide (DMSO) and γ-butyrolactone (GBL), the solvent used in the solvent surface treatment is also a mixed solvent of dimethylsulfoxide (DMSO) and γ-butyrolactone (GBL).

In some embodiments, the annealing temperature of the step e) is 150° C. to 190° C., such as 150, 160, 170, 180 and 190° C., and the annealing time is 1 to 10 hours, such as 1, 2, 3, 4, 5, 6, 7, 8, 9 and 10 hours.

In some embodiments, the slow cooling rate of the step f) is 0.1° C./min to 1° C./min, such as 0.1, 0.2, 0.3, 0.4, 0.5, 0.6, 0.7, 0.8, 0.9 and 1° C./min.

In some embodiments, the perovskite thick film disclosed herein, after repeated spraying, solvent surface treatment, annealing treatment, and slow cooling treatment, has a thickness of more than 200 μm, or between 200 μm and 1000 μm, or between 200 μm to 700 μm thickness, e.g. a thickness of 200, 205, 210, 220, 230, 240, 250, 300, 350, 400, 450, 500, 550, 600, 650, 700, 750, 800, 850, 900, 950 and 1000 μm.

The perovskite thick film prepared by the method mentioned above has a cubic crystal phase, and the X-ray diffraction analysis (XRD) pattern comprises a 15.0°~15.6° (100) signal, a 21.3°~21.9° (110) signal, the 30.3°~31.2° (200) signal, a 37.6°~38.2° (211) signal and a 43.5°~44.1° (220) signal.

In some embodiments, in the XRD pattern of the perovskite thick film, the (100), (110), (200), (211), and (220) signals are single peaks.

In some embodiments, a surface layer and a subsurface layer of the perovskite thick film do not contain lead, for example, the XPS analysis pattern does not have lead signals at 142.0 eV and 137.2 eV.

In some embodiments, the XPS analysis pattern of the surface layer and the subsurface layer of the perovskite thick film has a C—O bonding signal at 533.0 eV.

In some embodiments, the surface layer is a layer with a depth of about 0 to about 10 nm from the surface of the perovskite thick film; and the subsurface layer is a layer with a depth of greater than about 10 to about 50 nm from the surface of the perovskite thick film.

An embodiment further provides a radiation detector including a perovskite thick film, which can be prepared by the method mentioned above.

The radiation detector provided by an embodiment comprises: a substrate; a pixel array formed on the substrate; a perovskite thick film with a cubic crystal phase formed on the pixel array and a first electrode formed on the perovskite thick film and is opposite to the pixel array, and a readout circuit, wherein the perovskite thick film is formed by a perovskite having the chemical formula [A][B][X]$_3$, [A] is a monovalent cation selected from a group consisting of substituted or unsubstituted ammonium ions, substituted or unsubstituted amidine ions, Cs$^+$, Rb$^+$, Li$^+$ and Na$^+$; [B] is a divalent cation selected from a group consisting of Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Yb$^{2+}$, and Eu$^{2+}$; and [X] is a monovalent anion each independently selected from a group consisting of F$^-$, Cl$^-$, Br$^-$, I$^-$, SCN$^-$ and OCN$^-$, wherein the perovskite thick film comprises a crown ether compound, and the crown ether compound which is at least one selected from a group consisting of 12-crown-4, 15-crown-5, 18-crown-6, 21-crown-7, 24-crown-8, and 30-crown-10.

In some embodiments, the radiation detector is an X-ray sensor, a gamma ray sensor, or an X-ray and gamma ray sensor.

In some embodiments, the dark current density of the radiation detector is between 0.1 and 25 nA/cm2 (E=0.1 V/μm), or between 0.1 and 10 nA/cm2 (E=0.1 V/μm), or between 0.1 and 6 nA/cm2 (E=0.1 V/μm), or even less than 1 nA/cm2 (E=0.1 V/μm).

In some embodiments, the pixel array comprises a charge coupled device (CCD), a complementary metal oxide semiconductor (CMOS), or a thin film transistor (TFT).

Embodiments will be described in further detail with reference to the following examples, which are in no way intended to limit the scope of the embodiments.

Example 1—Effects of a Slow Cooling Treatment on Perovskite Thick Film

First, the perovskite precursor solution was prepared, in which CsBr and $PbBr_2$ were used as perovskite precursor salts, 18-crown-6 was used as crown ether compounds, γ-butyrolactone (GBL) and dimethylsulfoxide (DMSO) were used as solvents, the concentration of $CsPbBr_3$ in the obtained perovskite precursor solution is 0.2M, and the volume ratio of γ-butyrolactone (GBL) and dimethylsulfoxide (DMSO) is 2:8. Next, spray the perovskite precursor solution on the substrate under the background of atmospheric environment with ultrasonic spraying equipment, while heating the substrate to 160° C. to form a perovskite film. Then repeat the spraying several times to form a perovskite thick film, and observe the effect of slow cooling treatment on perovskite thick film.

Figure 1A:
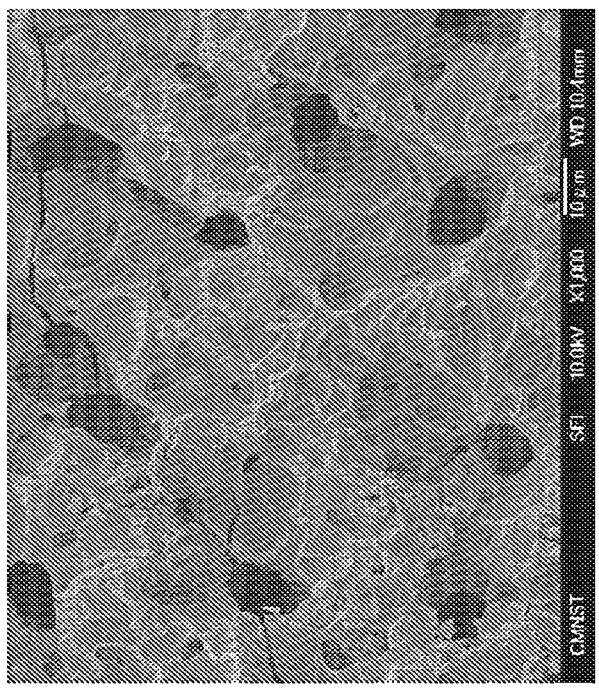
Figure 2:
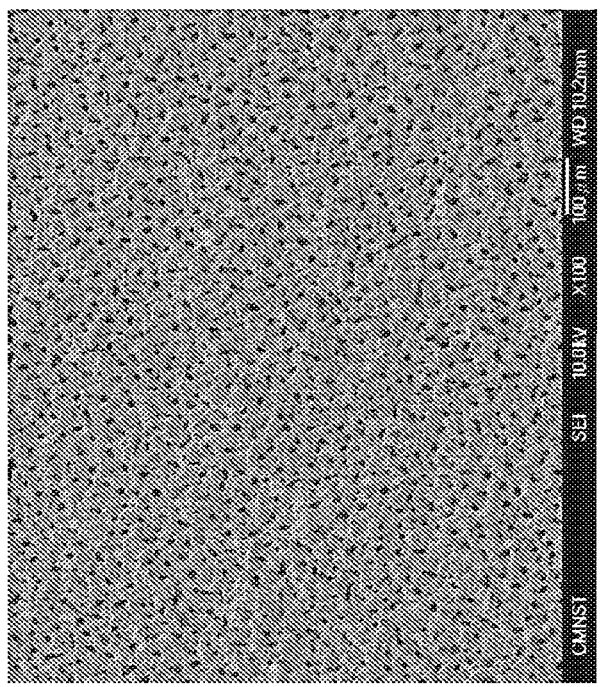
FIG. 2 is the SEM image of the perovskite thick film subjected to a slow cooling treatment in Example 1.

FIG. 1A and FIG. 1B are SEM images of the perovskite thick film without slow cooling treatment. FIG. 1B is an enlarged view of FIG. 1A. It can be observed from these two images that the perovskite thick film is cracked, which may be caused by stress that cannot be relieved. FIG. 2 is the SEM image of the perovskite thick film subjected to a slow cooling treatment of 1° C./min. The slow cooling treatment can relieve the film stress and prevent the thick film from cracking.

Example 2—Effects of the Solvent Ratio in the Perovskite Precursor Solution on the Properties of the Perovskite Thick Film Prepare the perovskite precursor solution and prepare the perovskite thick film according to Example 1, whereas the difference lay in the volume ratio of the γ-butyrolactone (GBL) solvent and the dimethylsulfoxide (DMSO) solvent in the perovskite precursor solution, which was adjusted to 2:8, 4:6, 5:5, 7:3 and 8:2.

Figure 3B:
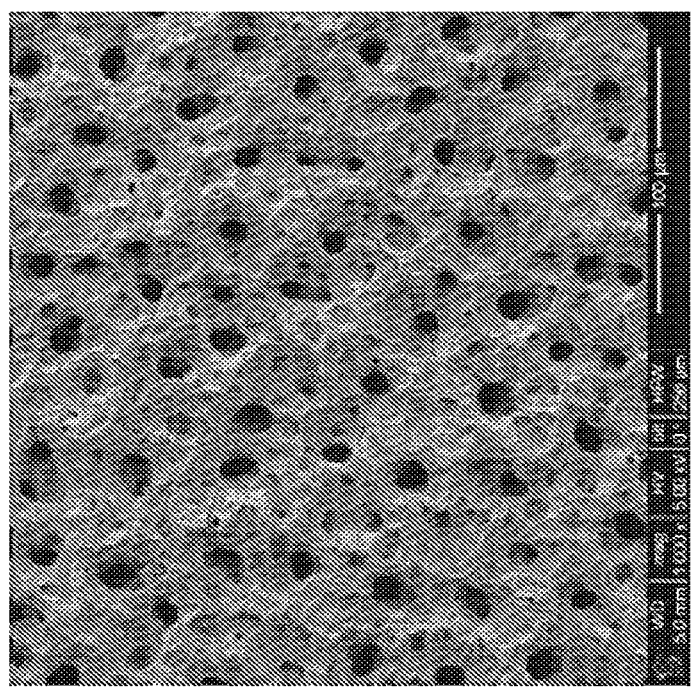
FIGS. 3A and 3B are the SEM images of the perovskite thick film prepared from the perovskite precursor solution with a volume ratio of GBL:DMSO=2:8 in Example 2.
Figure 3A:
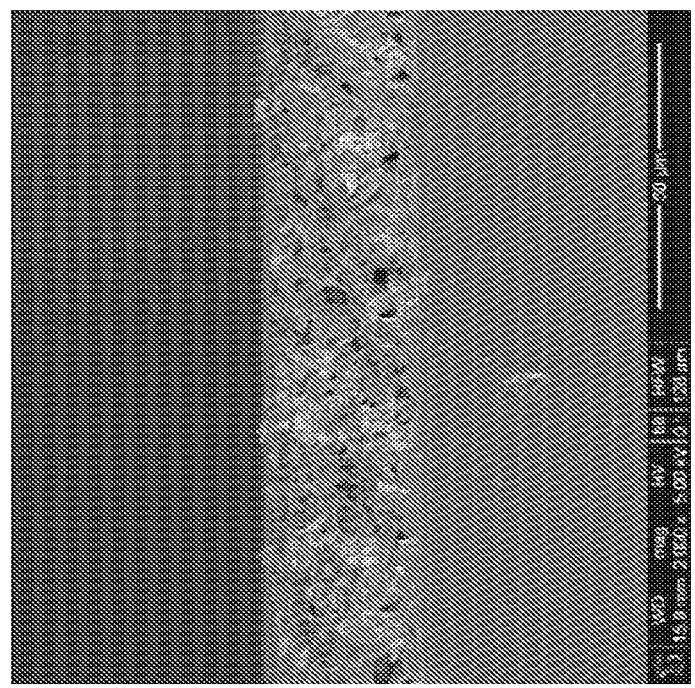
Figure 3D:
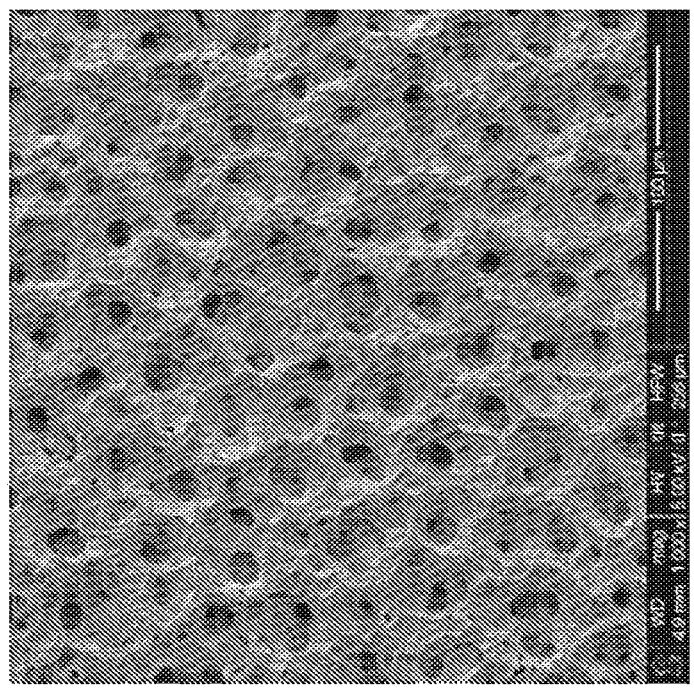
FIGS. 3C and 3D are the SEM images of the perovskite thick film prepared by the perovskite precursor solution with a volume ratio of GBL:DMSO=4:6 in Example 2.
Figure 3C:
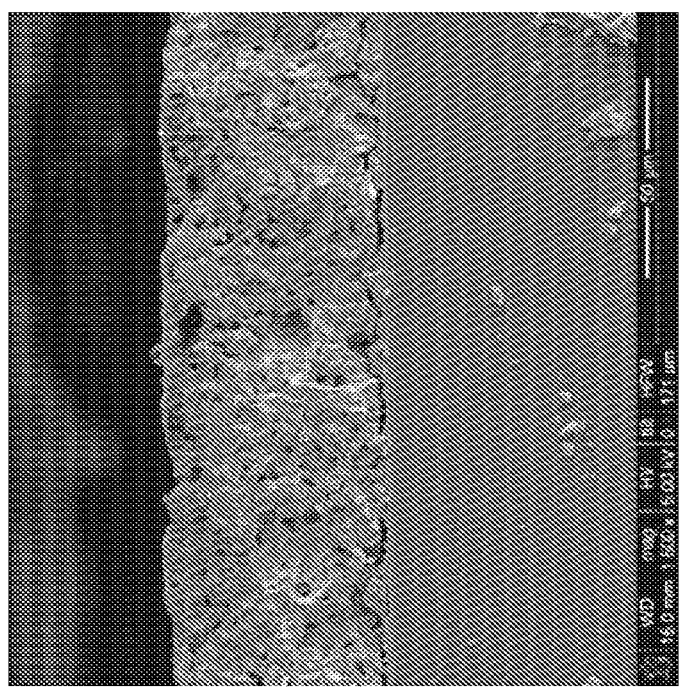
Figure 3F:
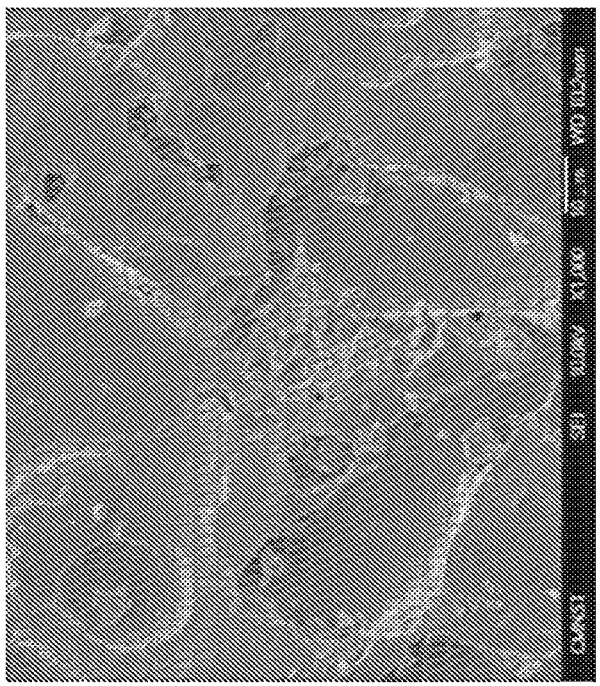
FIGS. 3E and 3F are the SEM images of the perovskite thick film prepared by the perovskite precursor solution in Example 2 with a volume ration of GBL:DMSO=5:5 in Example 2.
Figure 3E:
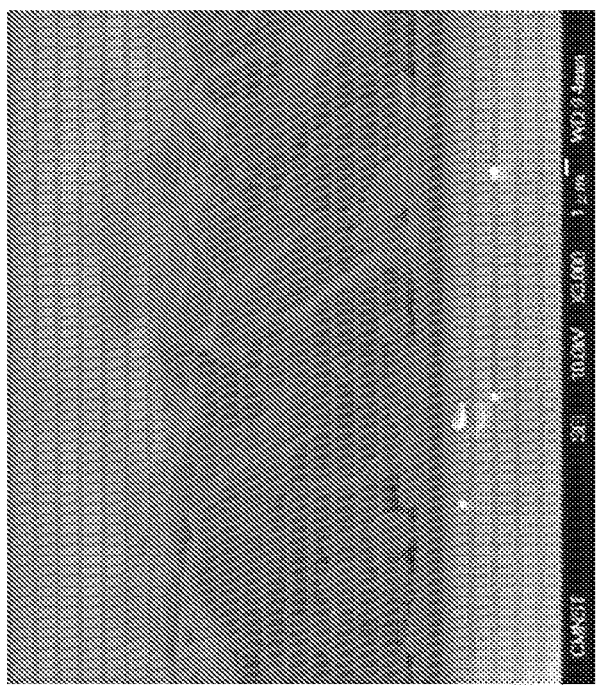
Figure 3H:
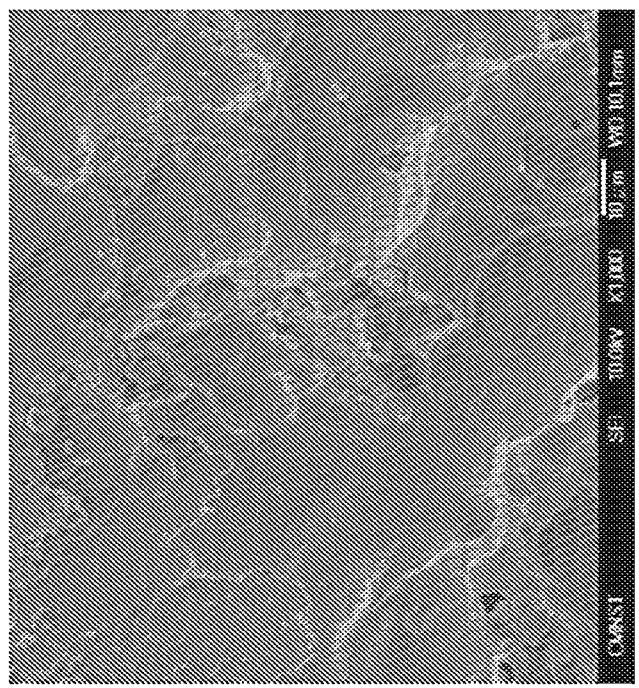
FIGS. 3G and 3H are the SEM images of the perovskite thick film prepared by the perovskite precursor solution with a volume ration of GBL:DMSO=7:3 in Example 2.
Figure 3G:
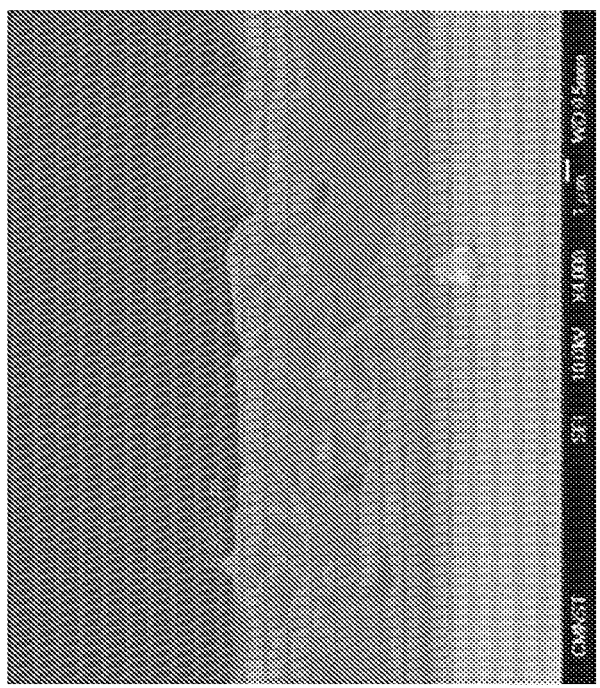
Figure 3J:
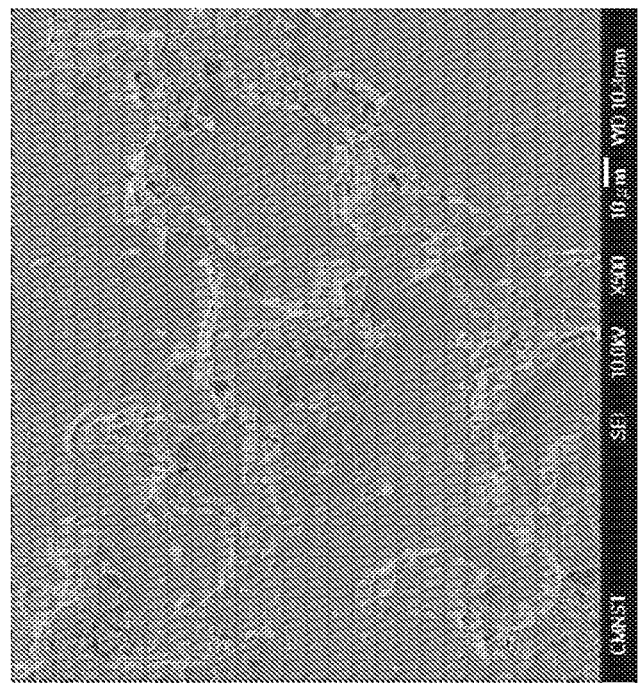
FIGS. 3I and 3J are SEM images of the perovskite thick film prepared from the perovskite precursor solution with a volume ratio of GBL:DMSO=8:2 in Example 2.
Figure 3I:
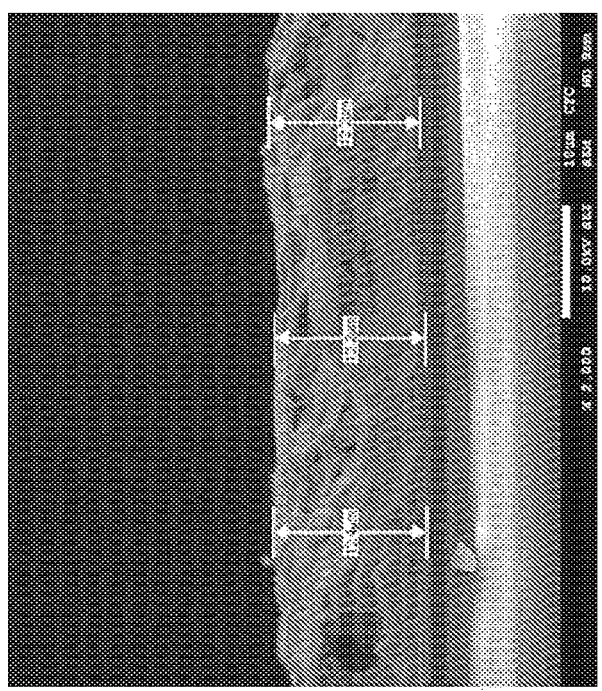

FIG. 3A and FIG. 3B are SEM images of the perovskite thick film formed using a solvent system of GBL:DMSO volume ratio=2:8, FIG. 3C and FIG. 3D are SEM images of the perovskite thick film formed using a solvent system of GBL:DMSO volume ratio=4:6, and FIG. 3E and FIG. 3F are SEM images of the perovskite thick film formed using a solvent system of GBL:DMSO volume ratio=5:5. From these results, it can be seen that as the proportion of GBL increases, the pores gradually decrease and the film-forming properties are gradually improved. From FIG. 3G and FIG. 3H which are SEM images of the perovskite thick film formed using a solvent system of GBL:DMSO volume ratio=7:3, and FIG. 3I and FIG. 3J which are SEM images of the perovskite thick film formed using a solvent system of GBL:DMSO volume ratio=8:2, pores are less and film-forming properties are great.

Example 3—Effects of a Solvent Surface Treatment on Surface Morphology of the Perovskite Thick Film Prepare perovskite precursor solution according to Example 1 (but GBL/DMSO volume ratio was 8:2 in the perovskite precursor solution, and the perovskite precursor solution did not contain crown ether) and prepare perovskite thick film (repeated spraying 20 times), and the mixed solvent GBL/DMSO=8:2 (volume ratio) was used for a surface treatment. The effect of the solvent surface treatment on the surface morphology of perovskite thick film was observed.

Figure 4:
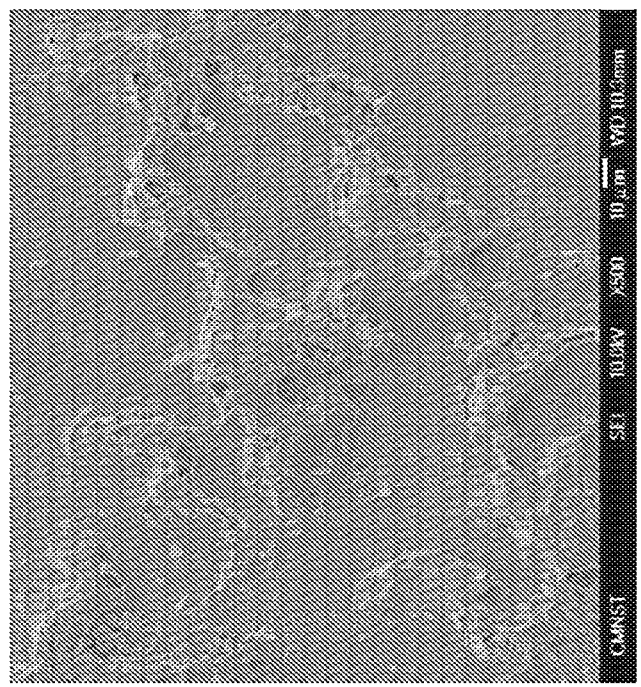
FIG. 4 is the SEM image of the perovskite thick film without a solvent surface treatment in Example 3.
Figure 5:
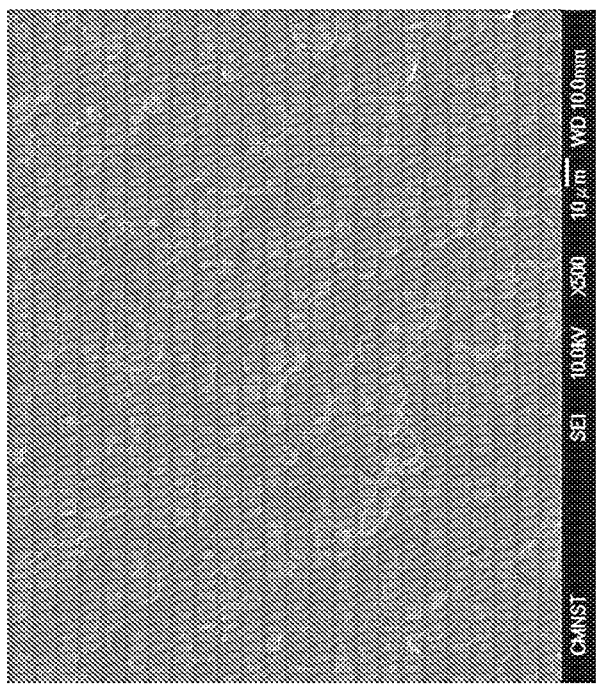
FIG. 5 is the SEM image of the perovskite thick film subjected to a solvent surface treatment in Example 3.

FIG. 4 is the SEM image of the perovskite thick film without solvent surface treatment, which shows that the surface of the perovskite thick film still has unevenness, and the uniformity needs to be improved; in contrast, as shown in FIG. 5, the surface of the perovskite thick film, which is surface-treated with the mixed solvent of GBL:DMSO volume ratio=8:2, is more smooth and uniform, and it is speculated that Ostwald ripening effect is occurred. For example, during spraying, the spraying solution contacts the surface of the substrate to start the nucleation and crystal growth, and then the solvent is added to the surface of the film to cause the Oswald ripening effect, making small crystals on the surface dissolve and restart the nucleation and crystal growth.

Example 4—Effects of Solvent System on Crystal Phase of Perovskite Thick Film

Prepare perovskite precursor solutions with various GBL:DMSO volume ratios and prepare perovskite thick films according to Example 2, and a solvent surface treatment for perovskite thick films according to Example 3 was used, wherein the solvent system used in the solvent surface treatment corresponded to the solvent and ratio used in each perovskite precursor solution.

Figure 6:
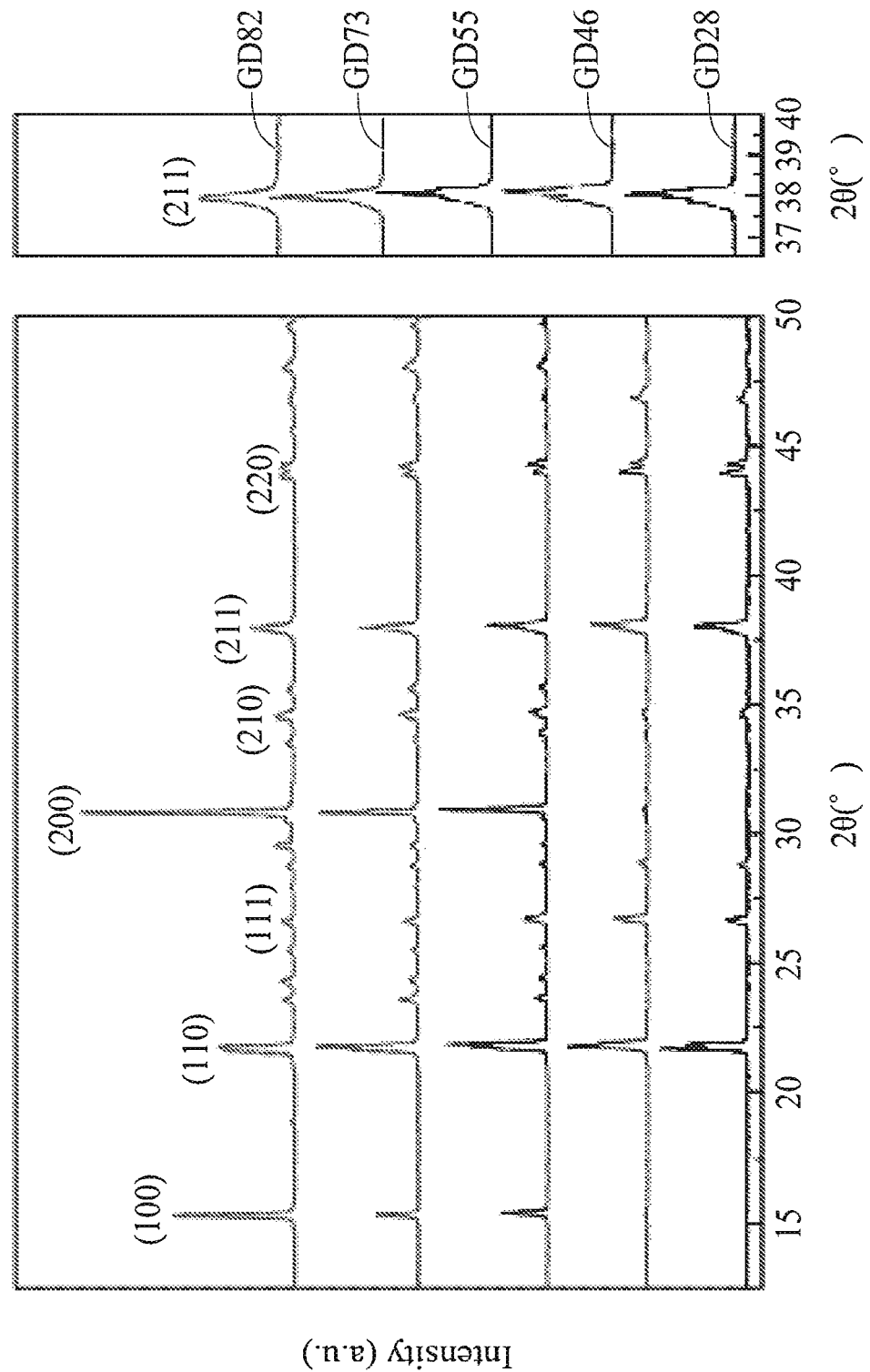
FIG. 6 is the XRD patterns of the perovskite thick films prepared from the perovskite precursor solution with various volume ratio GBL:DMSO in Example 4.

The XRD pattern, as shown in FIG. 6, shows that (110), (211) and (220) signals at 21.6°, 37.9° and 43.8°, respectively, appear in each perovskite thick film (formed by the perovskite precursor solutions with the solvent system of GBL:DMSO volume ratio=2:8, 4:6, 5:5, 7:3 and 8:2). However, (100) and (200) signals at about 15.3° and about 30.8°, respectively, and a single peak of (211) signal at about 37.9° only appear in the perovskite thick film formed by the perovskite precursor solutions with the solvent system of GBL:DMSO volume ratio=5:5, 7:3 and 8:2, showing the characteristics of the cubic crystal phase. This means that in addition to the original crystal phase, it also includes the cubic crystal phase. On the other hand, as the proportion of GBL increases, it can be seen that (100) signal at about 15.3° and (200) signal at about 30.8° increase in strength. Therefore, the solvent system affects whether the perovskite thick film has a cubic crystal phase.

Figure 7:
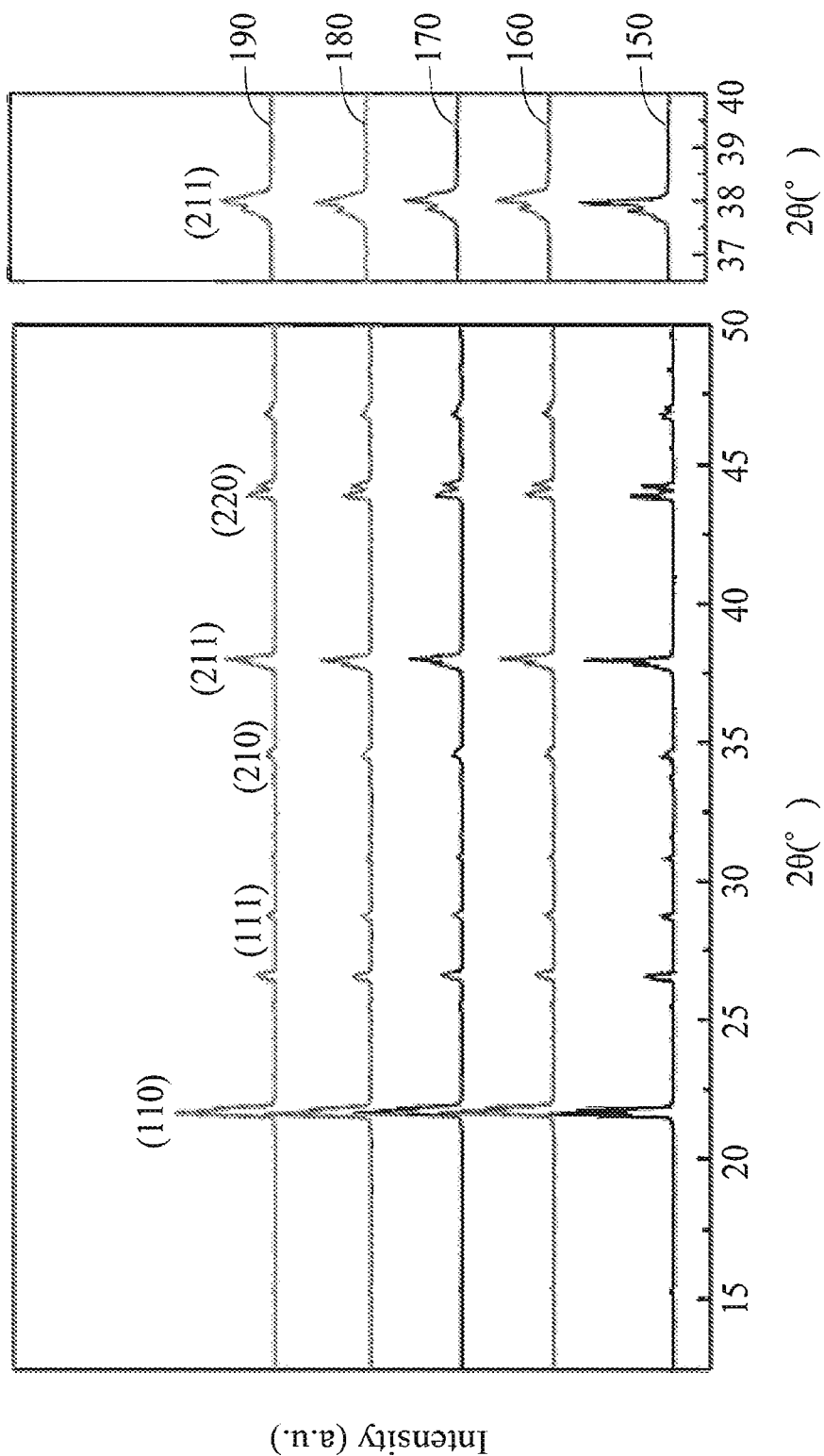
FIG. 7 is the XRD patterns of the perovskite thick films prepared from the perovskite precursor solution with volume ratio of GBL:DMSO=2:8 at various heating temperatures.

In addition, the XRD pattern shown in FIG. 7 shows that the perovskite thick films, formed by the perovskite precursor solution with a solvent system of GBL:DMSO volume ratio=2:8 at various heating substrate temperatures (150° C. to 190° C.), still do not exhibit (100), (110), (200), (211) and (220) signals, although these process temperatures are all higher than the phase transition temperature of the cubic crystal phase. That is to say, even though the process temperature is higher than the phase transition temperature of the cubic crystal phase, thick films containing the cubic crystal phase cannot be produced without adjusting the solvent system.

Example 5—Effects of the Time Difference of Repeated Spraying at the Same Position on the Perovskite Thick Film Prepare the perovskite precursor solutions according to Example 3 (but GBL/DMSO volume ratio=8:2 in the perovskite precursor solution) and prepare the perovskite thick films, whereas the difference was that the time difference between repeated spraying at the same position was controlled to be 50 seconds, 100 seconds, 150 seconds, 250 seconds, 350 seconds and 450 seconds.

Figure 8:
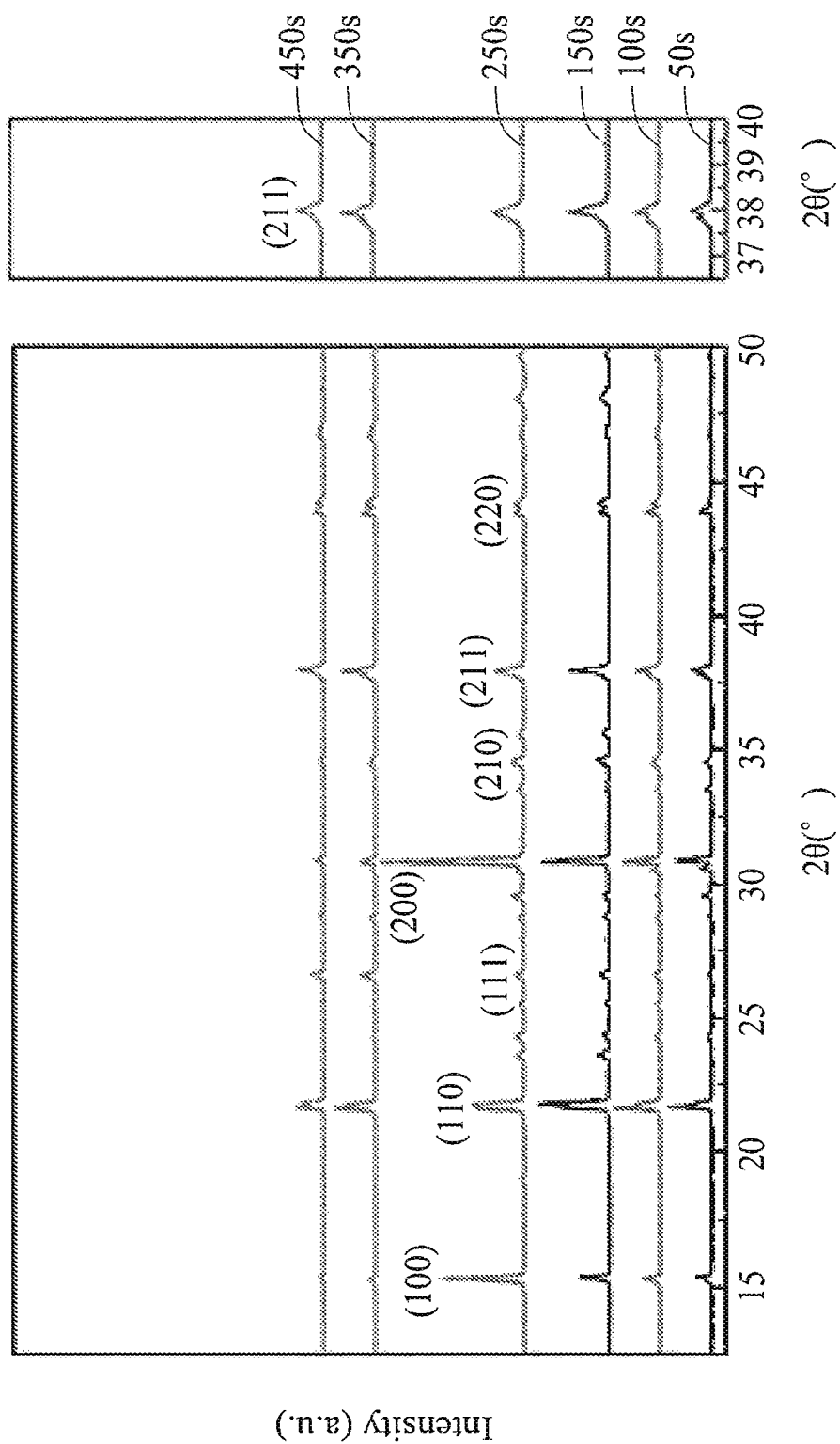
FIG. 8 is the XRD patterns of the perovskite thick film prepared under various time differences (ΔT) of repeated spraying at the same position in Example 5.

As shown in the XRD pattern of FIG. 8, the time difference between repeated spraying at the same position is between 100 seconds and less than 350 seconds to make the formed perovskite thick film have a cubic crystal phase (appear (100), (110), (200), (211) and (220) single peak signals). It is speculated that the Oswald ripening effect will occur during repeated spraying, and the specific repeated spraying time difference can control the speed of the Oswald ripening effect within an appropriate range.

Figure 9:
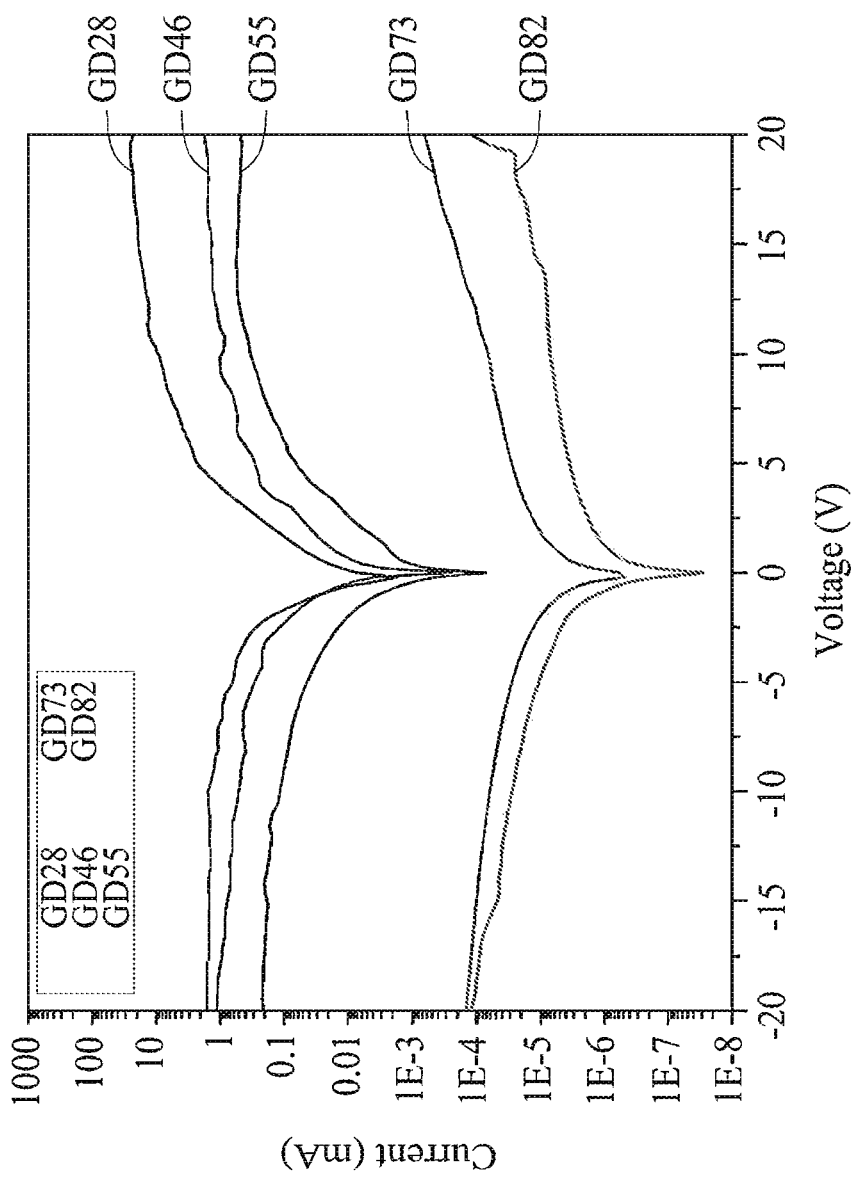
FIG. 9 is the IV diagrams of the X-ray detectors comprising the perovskite thick film prepared from the perovskite precursor solution with various GBL:DMSO volume ratio in Example 6.

Example 6—Effects of Solvent Systems on X-Ray Detectors Comprising Perovskite Thick Films Prepare perovskite precursor solutions with various GBL: DMSO volume ratios and prepare perovskite thick films according to Example 2, and carry out the solvent surface treatment for perovskite thick films according to Example 3, wherein the solvent system used in the solvent surface treatment corresponded to the solvent and ratio used in each perovskite precursor solutions. Then, prepare the X-ray detector: dispose $TiO_2$ (50 nm by sputtering), perovskite thick film (85 μm) and Au on the fluorine-doped tin oxide (FTO) substrate in sequence, that is, a $FTO/TiO_2/CsPbBr_3/Au$ element, and the element size was 1 cm$^2$. The dark current density of the X-ray detector was tested, and the results are shown in FIG. 9 and Table 1 below.

TABLE 1

| GBL:DMSO | Dark current (μA/cm$^2$) | E (V/μm) |
| --- | --- | --- |
| 2:8 | 1619 | 0.67 |
| 4:6 | 1127 | |
| 5:5 | 101.6 | |
| 7:3 | 0.14 | |
| 8:2 | 0.12 | |

It can be seen from the test results that the dark current density can be greatly improved by using X-ray detectors containing the perovskite thick film formed by GBL: DMSO=7:3 and 8:2 (volume ratio) solvent system, and these performances has caught up with the level of the commercial amorphous selenium X-ray detector (its dark current density is about 0.01 nA/cm2 (E=10 V/μm)).

Example 7—Effects of Thickness of the Perovskite Thick Films on X-Ray Detectors Comprising the Perovskite Thick Films Prepare perovskite precursor solution according to Example 1 (but GBL/DMSO volume ratio=8:2 in the perovskite precursor solution), and prepare X-ray detector: $FTO/TiO_2/CsPbBr_3/Au$ (size is 1 cm$^2$), according to Example 6, and the volume ratio of GBL:DMSO in the perovskite precursor solution was 8:2.

Figure 10:
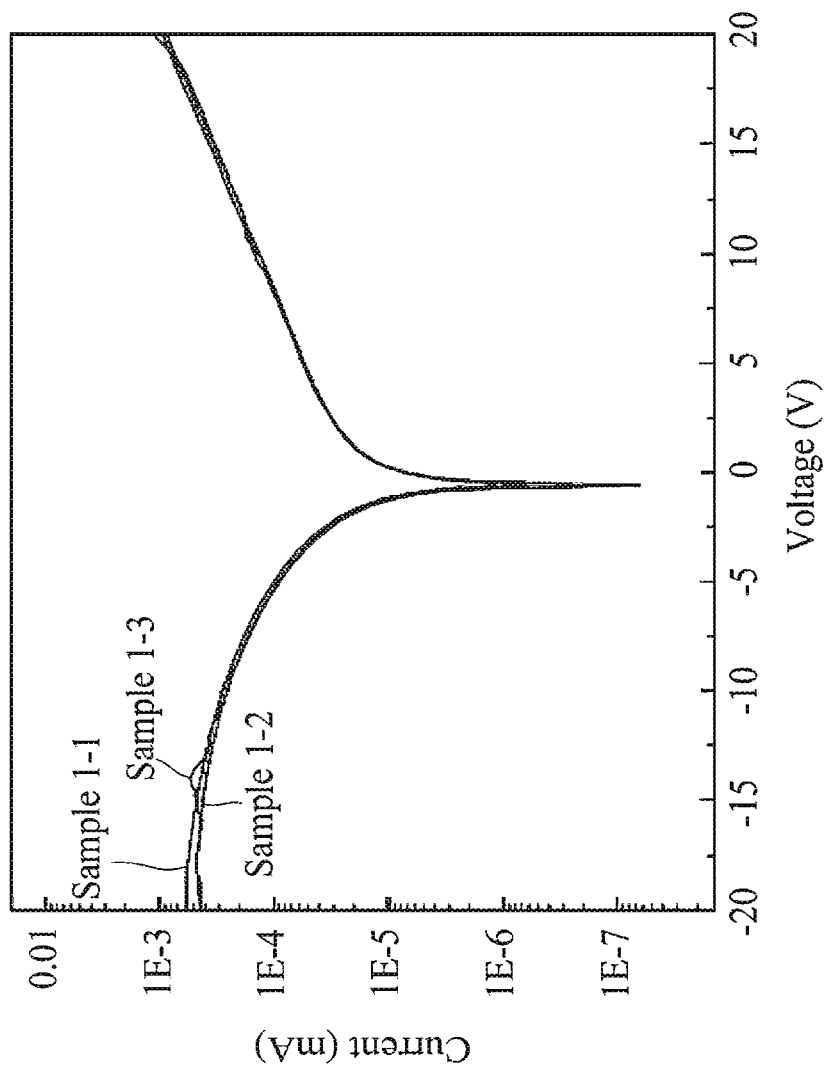
FIG. 10 is the IV diagrams of the X-ray detectors comprising the perovskite thick film with 100 μm thickness in Example 7.
Figure 11:
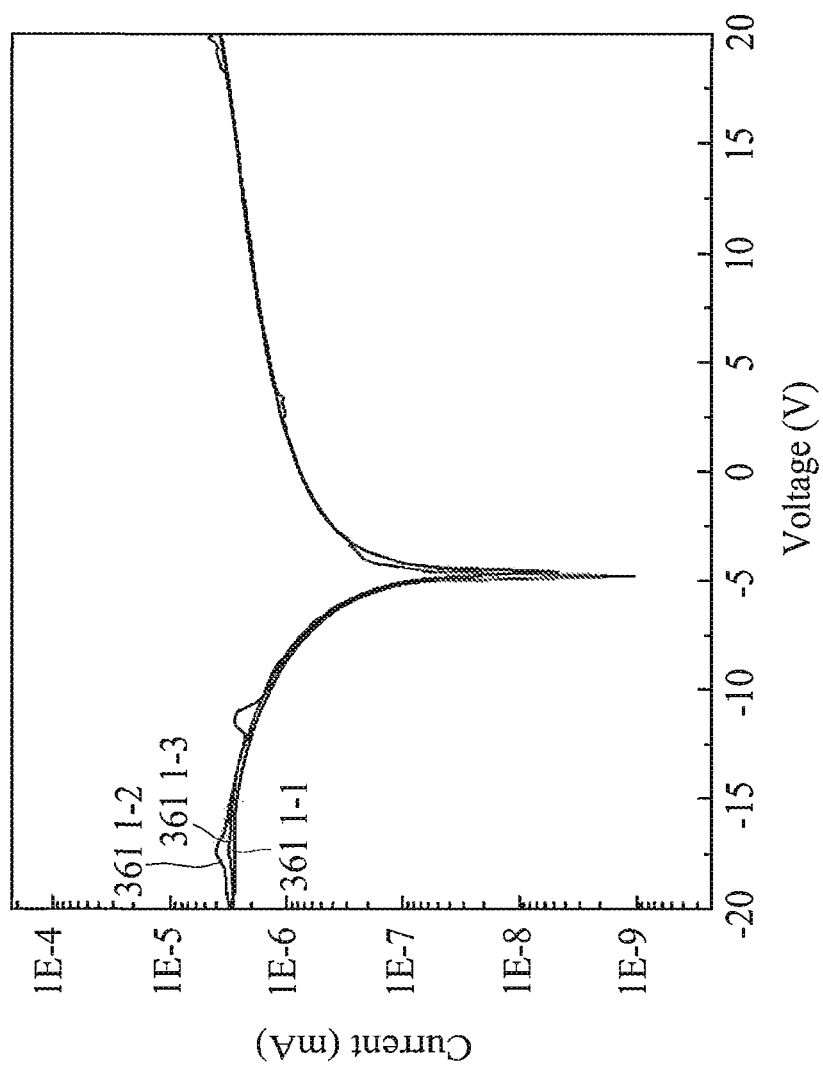
FIG. 11 is the IV diagrams of the X-ray detectors comprising the perovskite thick film with 200 μm thickness in Example 7.

The dark current density of X-ray detectors containing perovskite thick films with a thickness of 100 μm and 200 μm were tested, and the results are shown in FIG. 10 and FIG. 11, respectively. The dark current density of the X-ray detector containing perovskite thick films (samples 1-1 to 1-3) with a thickness of 100 μm is 476.67±68.06 nA/cm$^2$ (E=0.1 V/μm). The X-ray detector containing perovskite thick films (samples 361 1-1 to 1-3) with a thickness of 200 μm show the dark current density of 0.45±0.03 nA/cm$^2$ (E=0.1 V/μm) and good electrical stability. The example prepares a perovskite thick film with a thickness of 200 μm or more, so an X-ray detector with low dark current density can be achieved.

Example 8—Effects of Crown Ether Compounds on Perovskite Thick Film

Prepare perovskite precursor solution (GBL/DMSO volume ratio=8:2 in the perovskite precursor solution) and prepare the perovskite thick film according to Example 1, and the effects of adding or not adding crown ether compounds on perovskite thick films were compared.

Figure 12B:
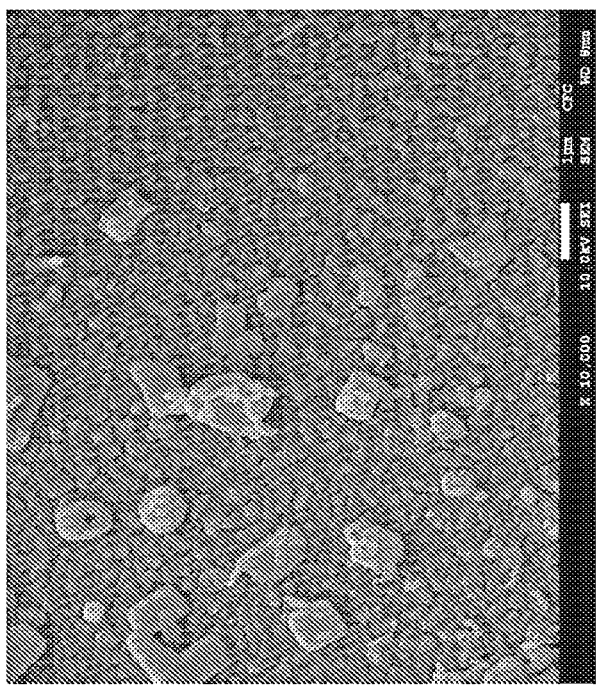
FIG. 12B is the SEM image of the perovskite thick film prepared from the same.
Figure 12A:
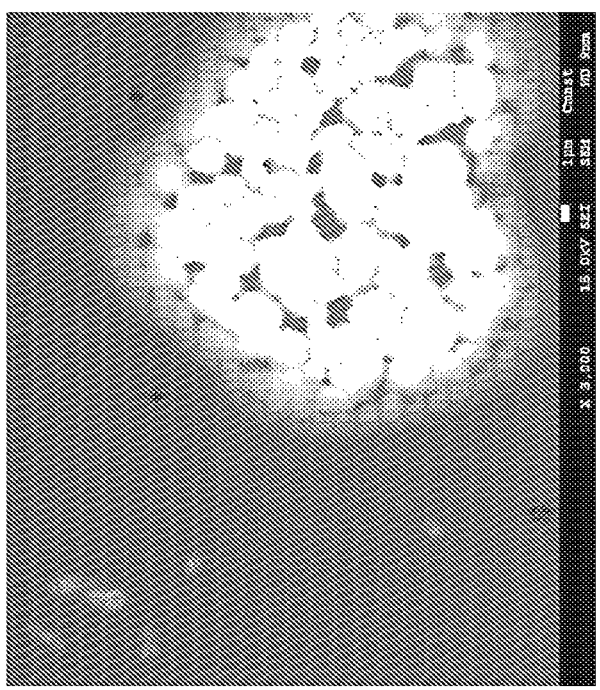
FIG. 12A is the SEM image of the perovskite precursor solution without crown ether compounds in Example 8.
Figure 13B:
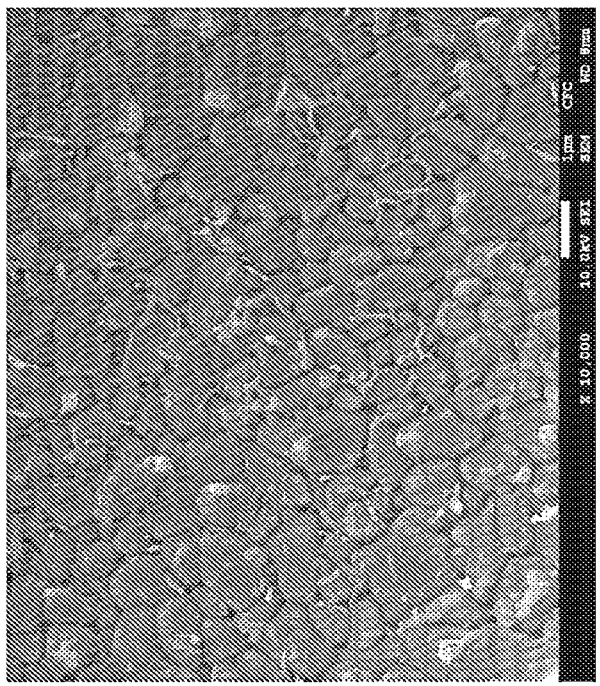
FIG. 13B is the SEM image of the perovskite thick film prepared from the same.
Figure 13A:
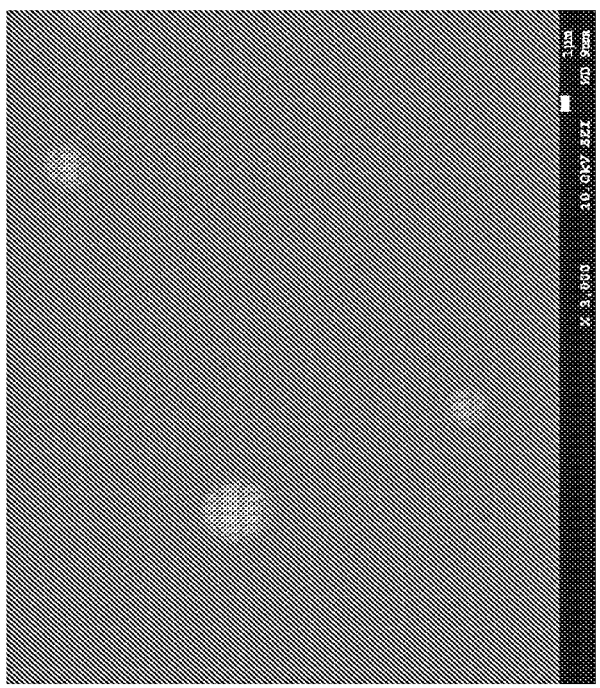
FIG. 13A is the SEM image of the perovskite precursor solution with crown ether compounds in Example 8.

FIG. 12A and FIG. 12B are the SEM images of the perovskite precursor solution without crown ether compounds and the perovskite thick film formed therefrom. Compared with them, the SEM images of the perovskite precursor solution adding 0.015 wt % of 18-crown-6 and the perovskite thick film formed therefrom as shown in FIG. 13A and FIG. 13B reveal that the radius of the perovskite colloid in the perovskite precursor solution is smaller and relatively consistent, and the perovskite thick film has larger grains.

Figure 14:
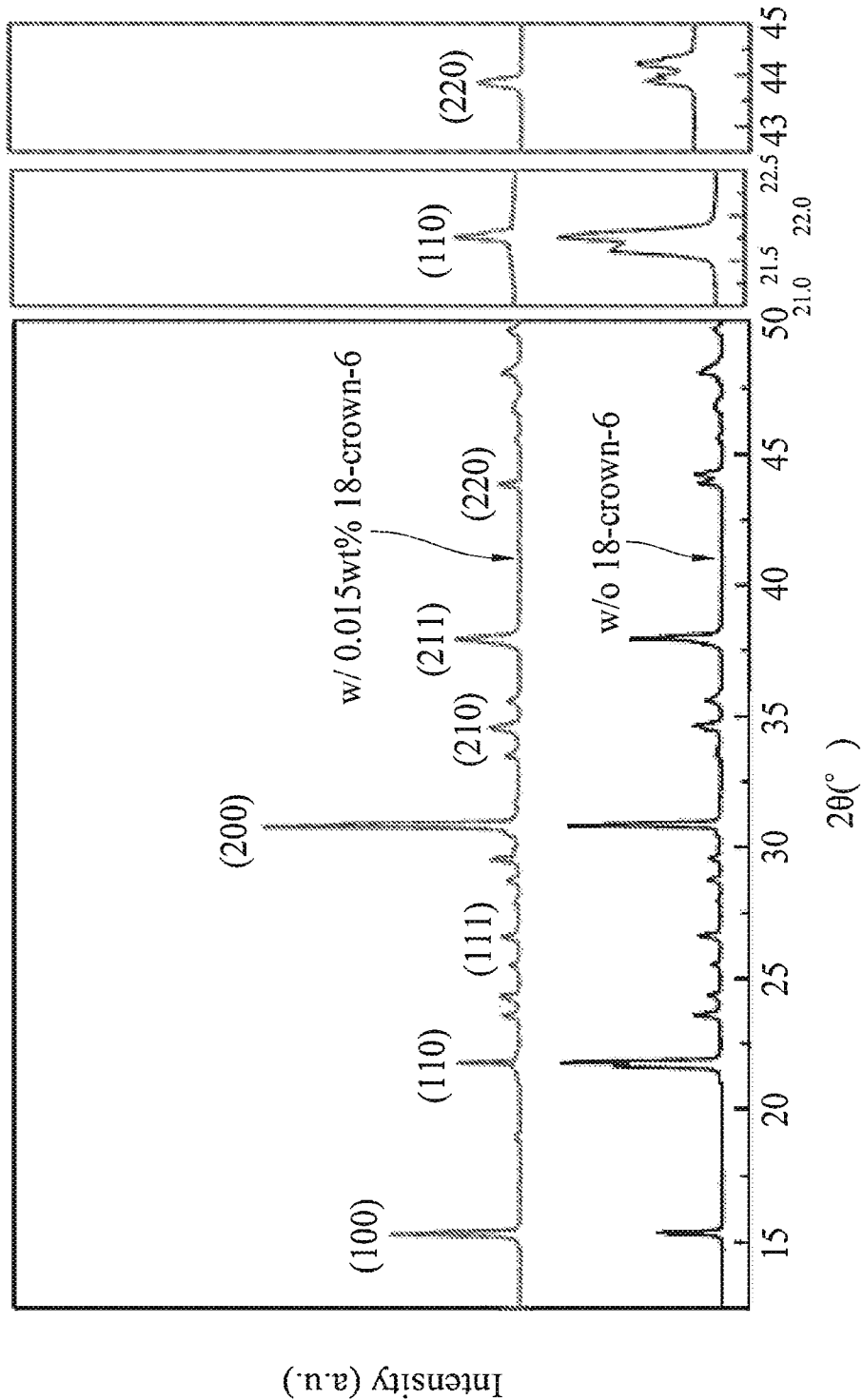
FIG. 14 is the XRD patterns of the perovskite thick films prepared from the perovskite precursor solution with or without crown ether compounds in Example 8.

XRD analysis was performed on the two perovskite thick films, as shown in FIG. 14. Adding 18-crown-6 can make the perovskite thick film into a film dominated by a cubic crystal phase, that is, the proportion of the cubic crystal phase increases significantly, which exhibits (100) signal at about 15.3°, (110) signal at about 21.6°, (200) signal at about 30.8°, (211) signal at about 37.9°, and (220) signal at about 43.8°, and all of them are single peaks.

Figure 15:
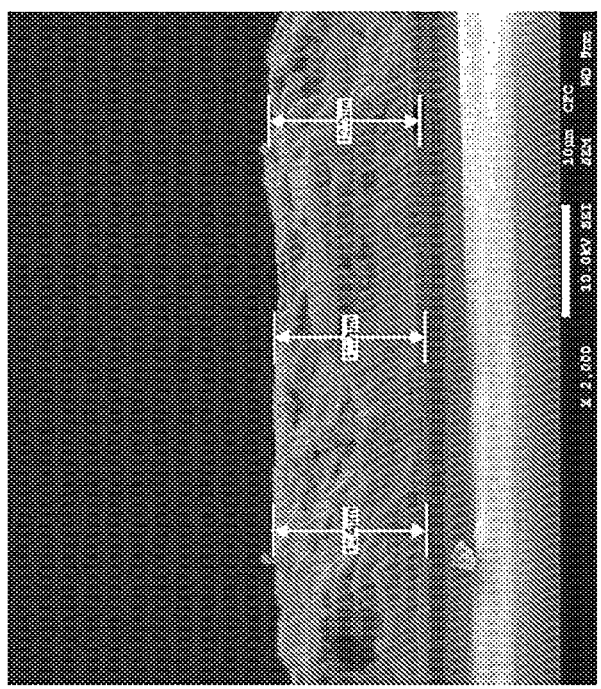
FIG. 15 is the SEM image of the perovskite thick film prepared from the perovskite precursor solution without crown ether compounds in Example 8.
Figure 16:
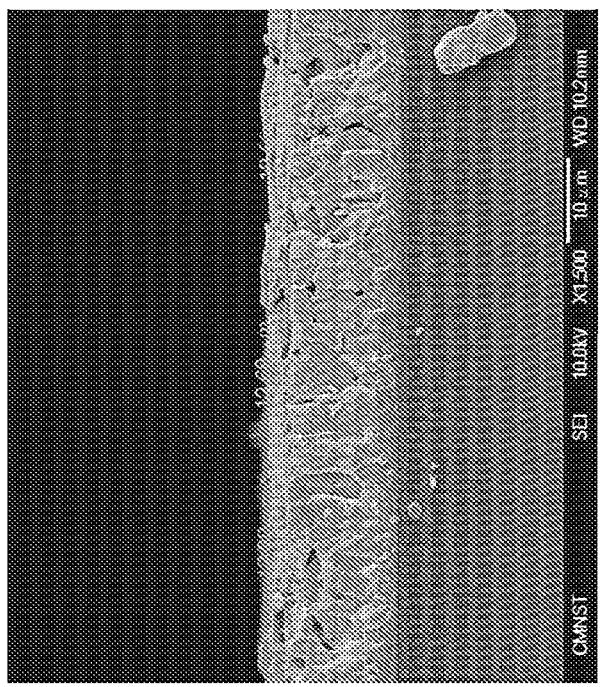
FIG. 16 is the SEM image of the perovskite thick film prepared from the perovskite precursor solution with crown ether compounds in Example 8.
Figure 17B:
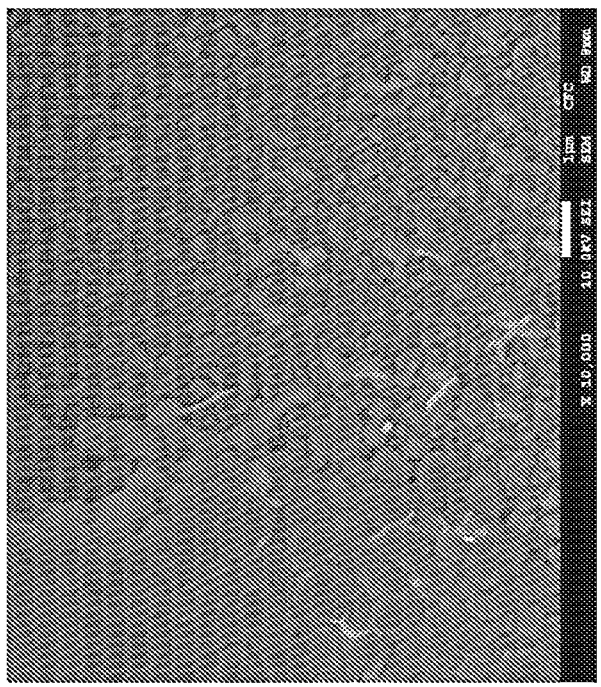
FIG. 17B is the SEM image of the perovskite thick film prepared from the precursor solution with 0.01 wt % crown ether compounds in Example 9.
Figure 17A:
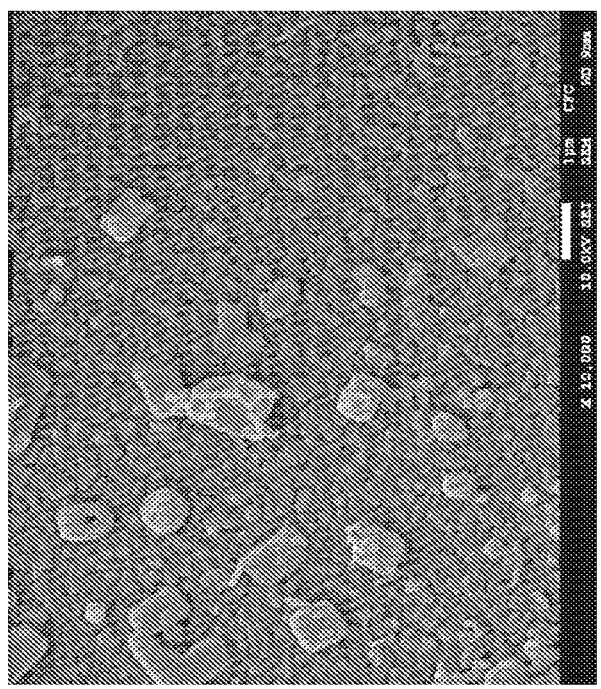
FIG. 17A is the SEM image of the perovskite thick film prepared from the perovskite precursor solution without crown ether compounds in Example 9.
Figure 17D:
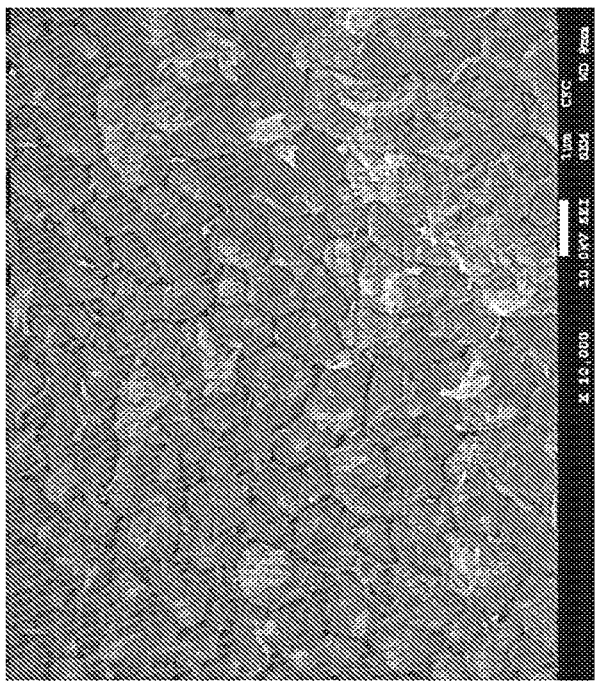
FIG. 17D is the SEM image of the perovskite thick film prepared from the perovskite precursor solution with 0.02 wt % crown ether compounds in Example 9.
Figure 17C:
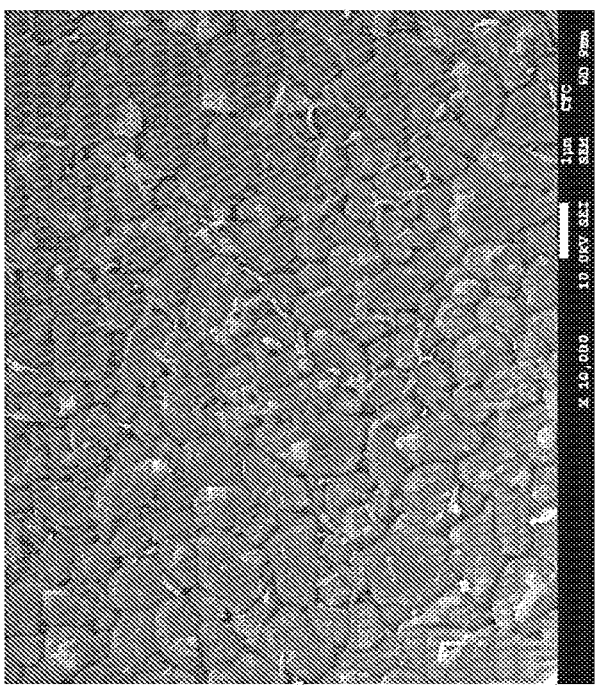
FIG. 17C is the SEM image of the perovskite thick film prepared from the perovskite precursor solution with 0.015 wt % crown ether compounds in Example 9.

Further, SEM images were taken of cross sections of the perovskite thick films formed by the perovskite precursor solution without crown ether compounds and by the perovskite precursor solution with 0.015 wt % of 18-crown-6, and the results are shown in FIG. 15 and FIG. 16, respectively. It can be seen from these images that the addition of 18-crown-6 can obtain a thick film of cubic crystal phase perovskite tending to columnar crystals.

Example 9—Effects of Crown Ether Compounds on X-Ray Detectors Containing Perovskite Thick Films First prepare the perovskite precursor solution according to Example 1, whereas the difference was the addition of 0 wt %, 0.01 wt %, 0.015 wt %, and 0.02 wt % of 18-crown-6, and the preparation of perovskite thick films with a thickness of 10 μm to 15 μm. Their SEM images are shown in FIG. 17A to FIG. 17D, respectively. Similar to the aforementioned Example 8, it can be seen from FIG. 17A to FIG. 17D that as the content of 18-crown-6 increases, the crystal grains of the perovskite thick film become larger.

Figure 18:
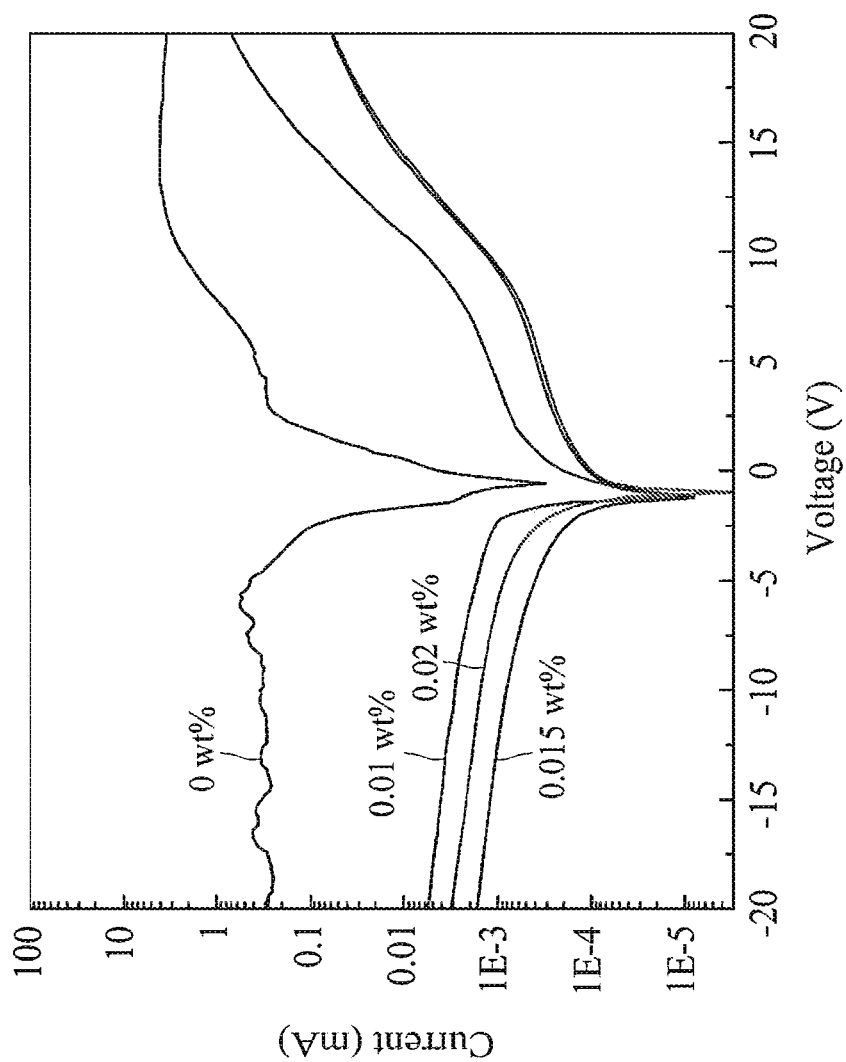
FIG. 18 is the IV diagrams of the X-ray detectors comprising various perovskite thick films in Example 9.

Then, these perovskite thick films were used to prepare X-ray detectors: $FTO/TiO_2/CsPbBr_3/Au$ (size is 1 cm$^2$)

according to Example 6, and the test results of their dark current density are shown in FIG. 18. As the content of 18-crown-6 increases, the dark current density becomes lower.

Example 10—Sensitivity of X-Ray Detectors Comprising Perovskite Thick Films

Prepare perovskite precursor solutions by 0.2M CsPbBr$_3$ GBL:DMSO volume ratio=8:2 with or without 18-crown-6, and prepare perovskite thick films (thickness is 200 µm). Then, the surface treatment for thick films was performed by using various mixing ratios of GBL and DMSO solvents, specifically as the following combinations: (1) GBL:DMSO volume ratio=2:8 and no 18-crown-6 was added, (2) GBL:DMSO volume ratio=8:2 and no 18-crown-6 was added, (3) GBL:DMSO volume ratio=8:2 and 0.015 wt % of 18-crown-6 was added. And, prepare the X-ray detector: FTO/TiO$_2$/CsPbBr$_3$/Au (size is 1 cm$^2$) according to Example 6. Next, the sensitivity test was performed with the dental computed tomography (dental CT) system of Yang-Ming University under the condition of 50 kVp and 2 mA.

$$\text{sensitivity} = \frac{J_{Photonic} - J_{Dark}}{\text{Dose rate}}$$

Figure 19:
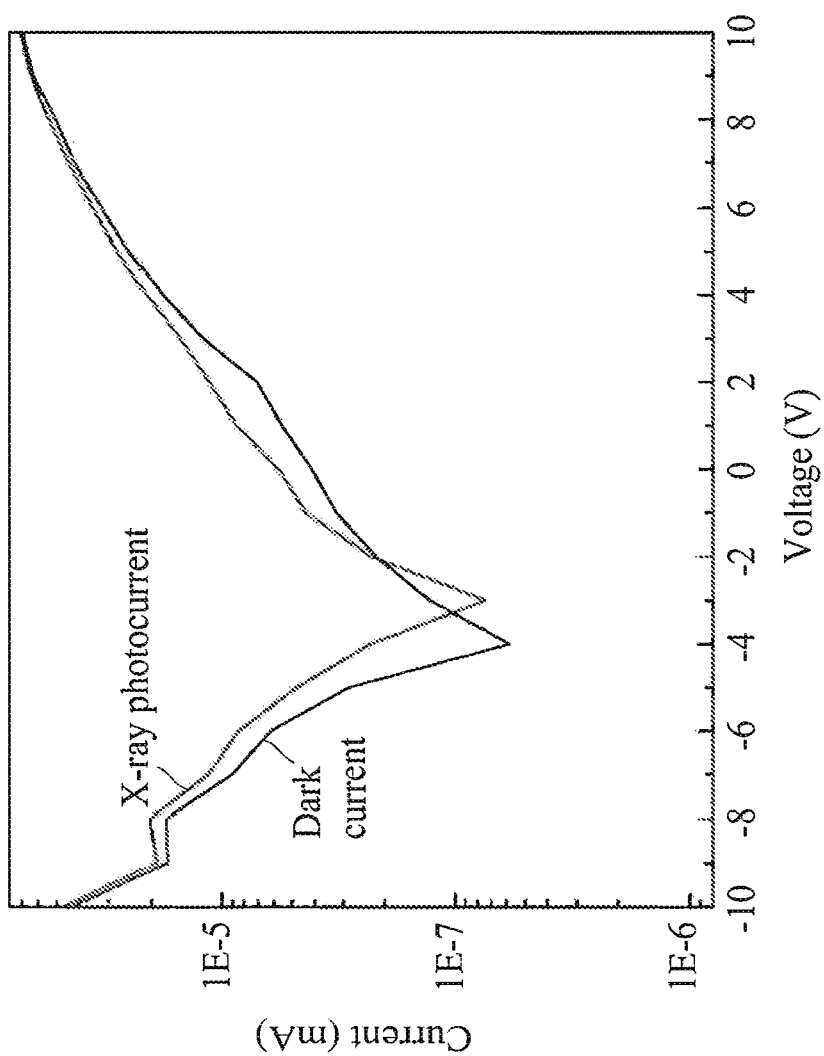
FIG. 19 is the IV diagrams of the X-ray detectors comprising the perovskite thick film prepared from the perovskite precursor solution with the volume ratio GBL:DMSO=2:8 and without crown ether compounds in Example 10.
Figure 20:
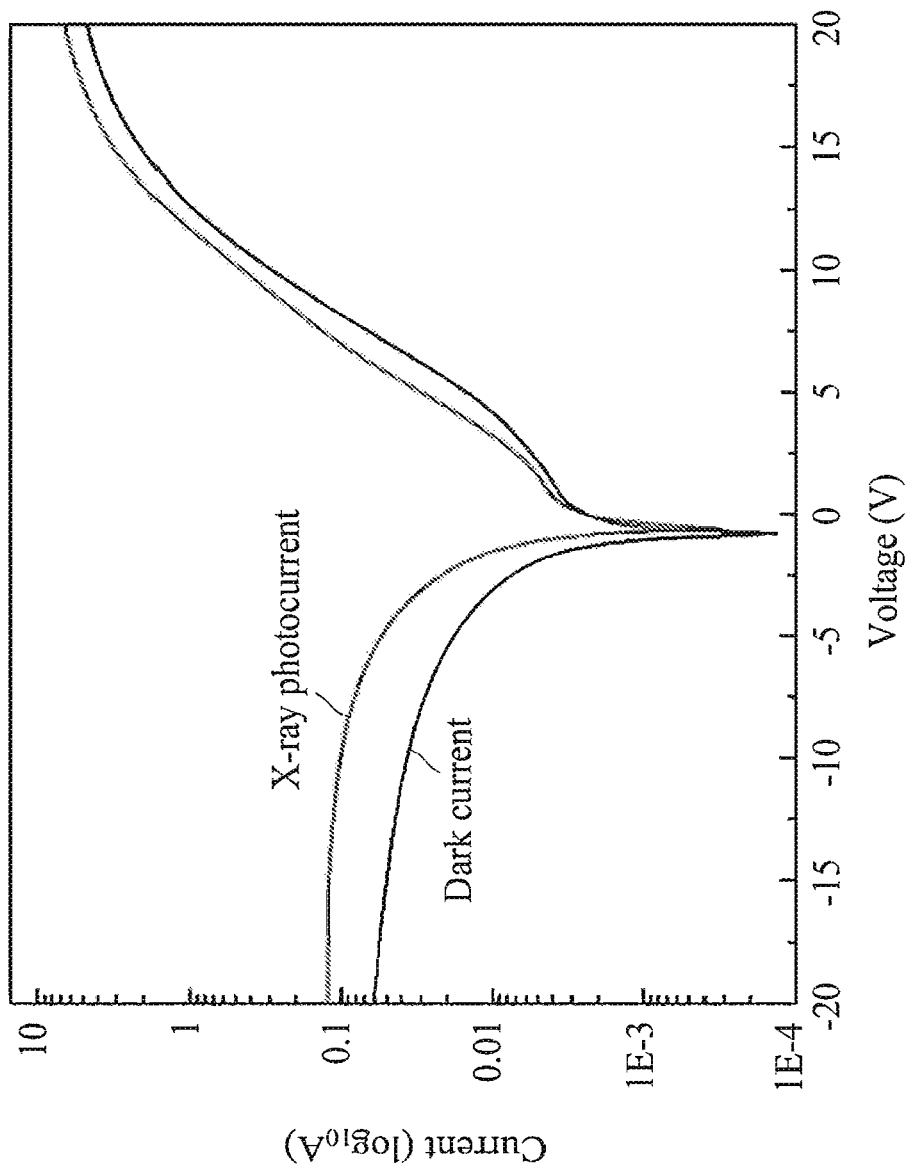
FIG. 20 is the IV diagrams of the X-ray detectors comprising the perovskite thick film prepared from the perovskite precursor solution with the volume ratio of GBL:DMSO=8:2 and without crown ether compounds in Example 10.
Figure 21:
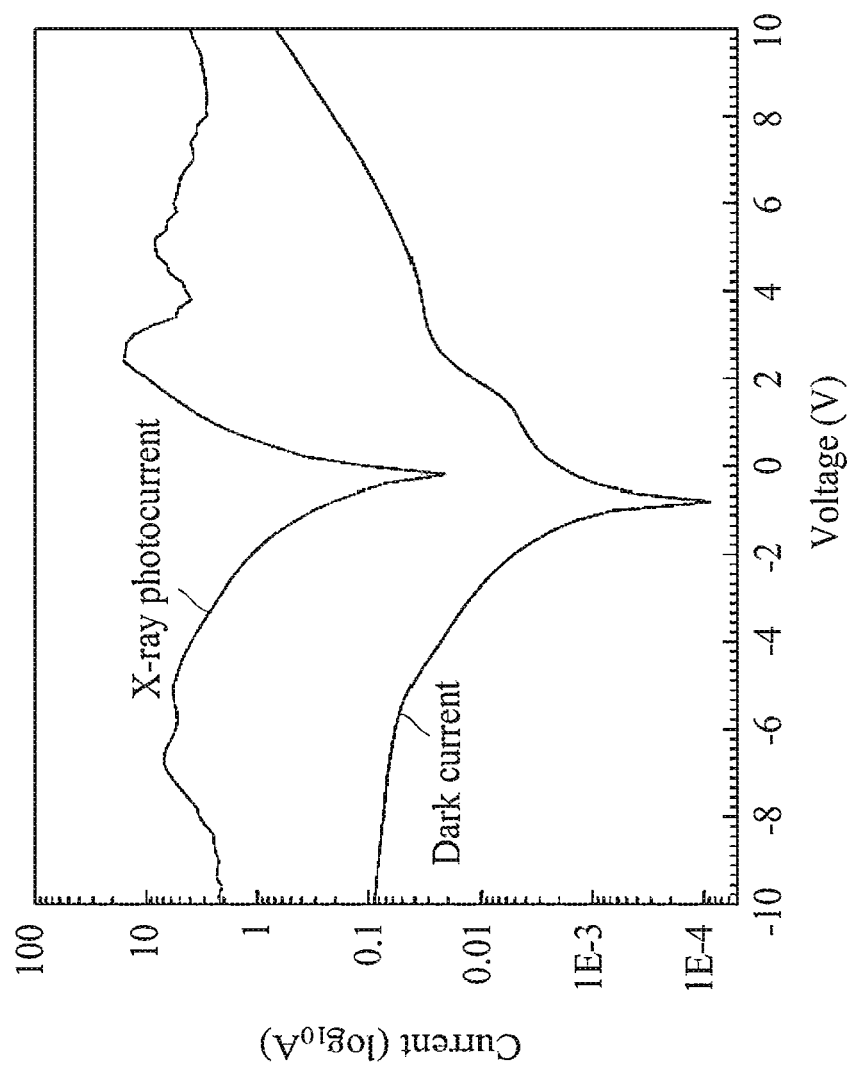
FIG. 21 is the IV diagrams of the X-ray detectors comprising the perovskite thick film prepared from the perovskite precursor solution with volume ratio of GBL:DMSO=8:2 and with 0.015 wt % crown ether compounds in Example 10.

FIG. 19 to FIG. 21 are results of (1) GBL:DMSO volume ratio=2:8 and no 18-crown-6 was added, (2) GBL:DMSO volume ratio=8:2 and no 18-crown-6 was added, and (3) GBL:DMSO volume ratio=8:2 and 0.015 wt % of 18-crown-6 was added, respectively, wherein DC means dark current and XP means X-ray photocurrent. The results showed that the sensitivity of the group of GBL:DMSO volume ratio=2:8 and no 18-crown-6 added is 221.6 µCGy$^{-1}$ cm$^{-2}$, the sensitivity of the group of GBL:DMSO volume ratio=8:2 and no 18-crown-6 added is 3.74×10$^4$ µCGy$^{-1}$ cm$^{-2}$, and the sensitivity of the group of GBL:DMSO volume ratio=8:2 and 0.015 wt % of 18-crown-6 added is the highest, 9.1×10$^4$ µCGy$^{-1}$ cm$^{-2}$.

Moreover, the sensitivity of the perovskite thick-film X-ray detector disclosed herein is much better than the sensitivity of the commercial amorphous selenium X-ray detector, which is 20 µCGy$^{-1}$ cm$^{-2}$.

Figure 22:
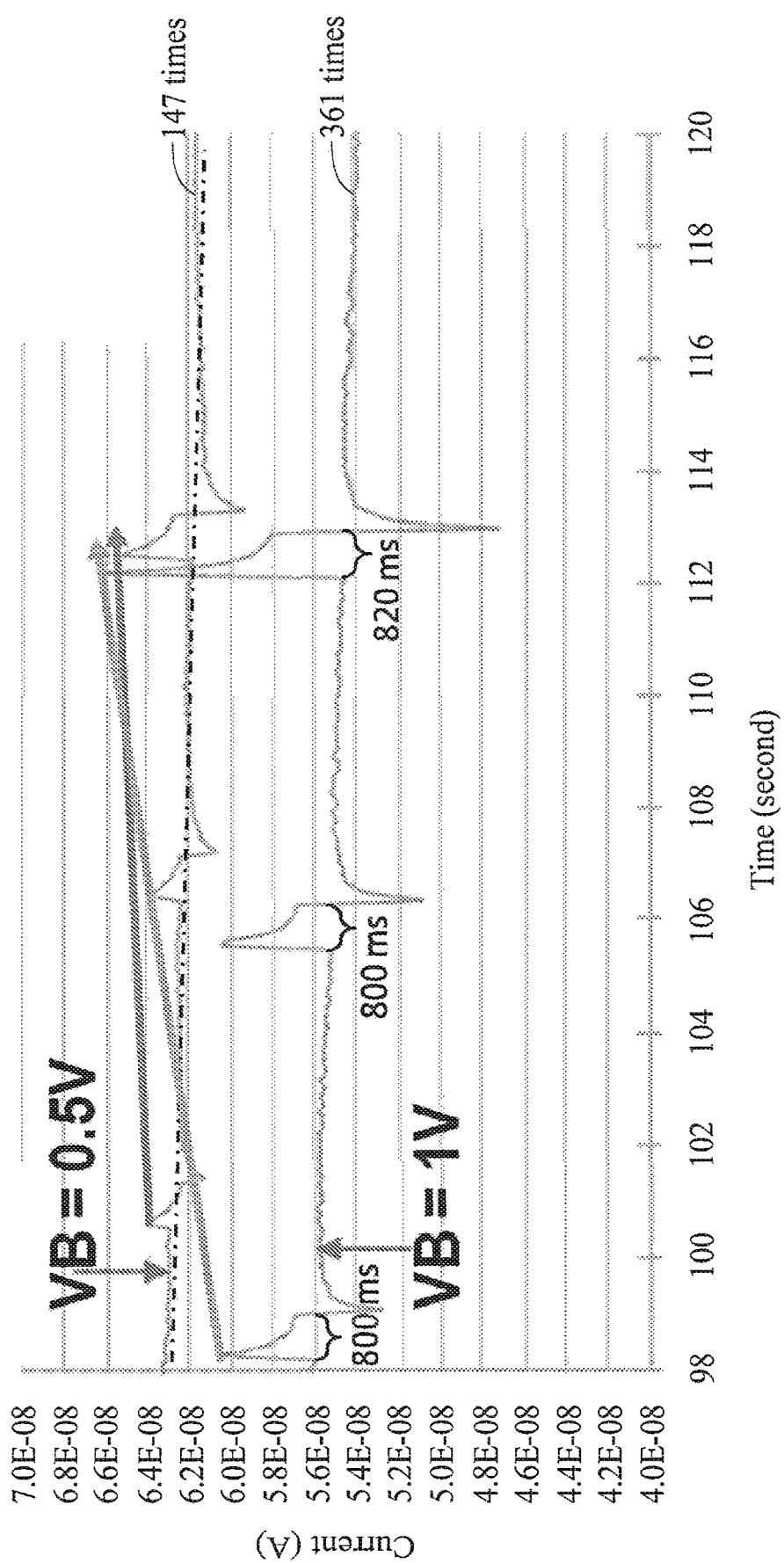
FIG. 22 is the X-ray current-time diagrams of the X-ray detector of Example 11.

Example 11—Time Delay Rate of X-Ray Detectors Comprising Perovskite Thick Film X-ray detector: FTO/TiO$_2$/CsPbBr$_3$/Au (size is 1 cm$^2$) was prepared according to Example 6, wherein the content of CsPbBr$_3$ was 0.2M, GBL:DMSO volume ratio was=8:2 in the perovskite precursor solution, and the content of 18-crown-6 was 0.015 wt %. Then, the time delay rate test was carried out by InnoCare Optoelectronics Laboratory under the condition of 70 kVp and a exposure time of 800 ms, and the results are shown in FIG. 22, wherein 361 times means that the number of spraying times was 361 times, corresponding to a perovskite thick film thickness of 240 µm; and 147 times means that the number of spraying times was 147 times, corresponding to a perovskite thick film thickness of 120 µm. The dark current densities of spraying 361 times and 147 times are 54 nA/cm$^2$ and 62 nA/cm$^2$, respectively. The larger the film thickness, the slightly lower dark current density. However, there is little difference in delay time between spraying 361 times and 147 times, the delay time is both less than 20 ms, and the average delay rate is about 0.83%.

Example 12—Effect of Staged Heating on Perovskite Thick Films

X-ray detector: FTO/TiO$_2$/CsPbBr$_3$/Au (size is 1 cm$^2$) was prepared according to Example 6, wherein the content of CsPbBr$_3$ in the perovskite precursor solution was 0.2M, GBL:DMSO volume ratio was=8:2, the content of 18-crown-6 was 0.015 wt %, and the substrate was directly heated to 160° C. or heated to 160° C. in stages during repeatedly spraying the perovskite precursor solution, wherein said heating to 160° C. in stages specifically includes: heating to 152° C. for the first 50 repeated sprayings, heating to 155° C. for the 51st to 100th repeated spraying, heating to 157° C. for the 101st to 200th repeated spraying, and heating to 160° C. for the 201st and following repeated spraying.

Figure 23:
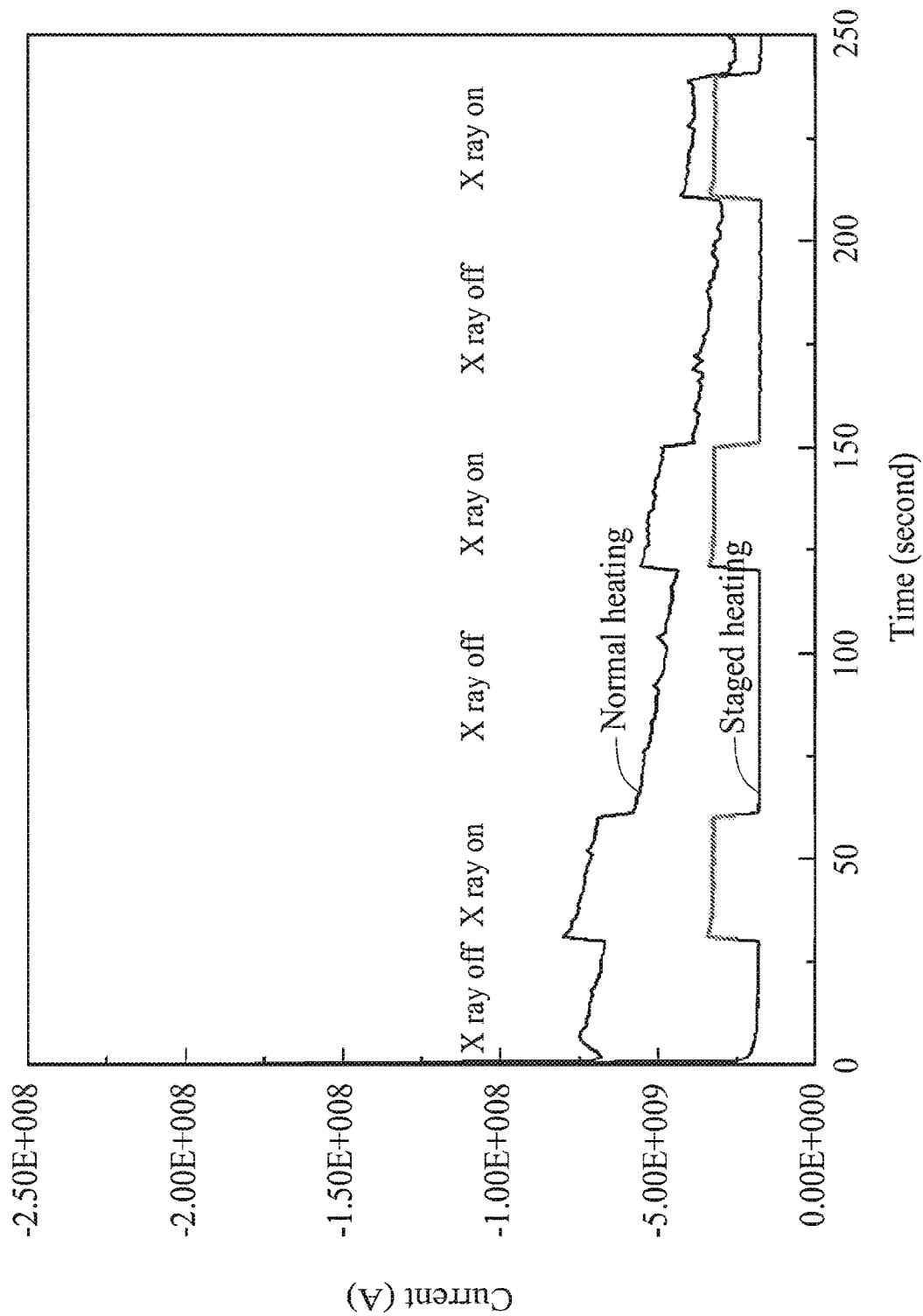
FIG. 23 is the X-ray current-time diagrams of the X-ray detector comprising the perovskite thick film prepared by direct heating or staged heating in Example 12.

I-t scanning electrical measurement under the conditions of 100 kVp, 5 mA: bias-1V was performed using the dental computerized tomography (dental CT) system of Yang-Ming University, and the results are shown in FIG. 23. The background dark current density of the perovskite thick film prepared by staged heating reaches a stable value of 1.6 nA/cm$^2$ within 10 s. On the contrary, the background dark current density of the perovskite thick film prepared by direct heating needs to wait until about 250 s to become stable. Moreover, the perovskite thick film prepared by staged heating has an average change rate of photocurrent of only 0.41% per excitation, showing excellent stability to X-rays.

Example 13—Effects of Annealing Treatment on the X-Ray Detectors Comprising Perovskite Thick Films X-ray detector: FTO/TiO$_2$/CsPbBr$_3$/Au (size is 1 cm$^2$) was prepared according to Example 6, wherein the content of CsPbBr$_3$ in the perovskite precursor solution was 0.2M, GBL:DMSO volume ratio was=8:2, the content of 18-crown-6 was 0.015 wt %, the perovskite thick film was subjected to an anneal treatment for 2 hours after repeated spraying, and the annealing temperature was between 130° C. and 190° C.

Figure 24:
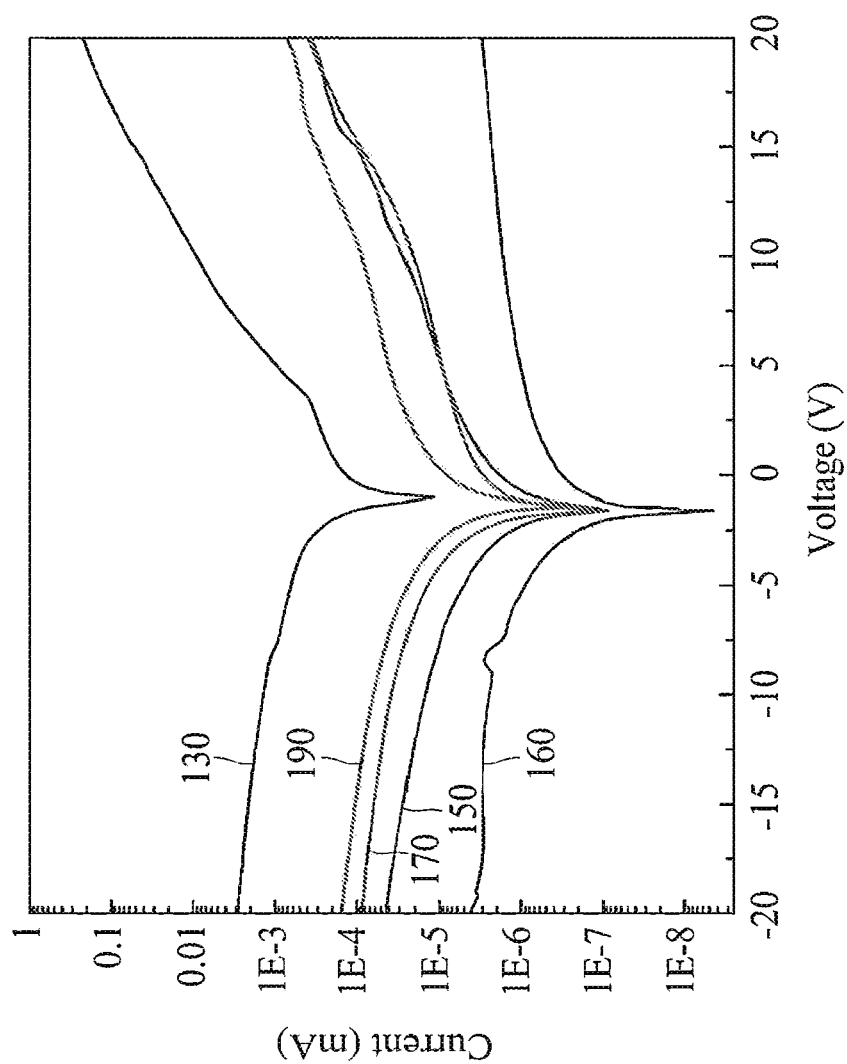
FIG. 24 is the IV diagram of the X-ray detector comprising the perovskite thick film prepared at various annealing temperatures in Example 13.

As shown in FIG. 24, the perovskite thick film exhibits different properties after the anneal treatment at various annealing temperatures. The dark current density is not ideal at an annealing temperature of 130° C. The dark current density is better at an annealing temperature of 150° C., 160° C., 170° C., and 190° C., and the dark current density is the lowest at an annealing temperature of 160° C.

Figure 25:
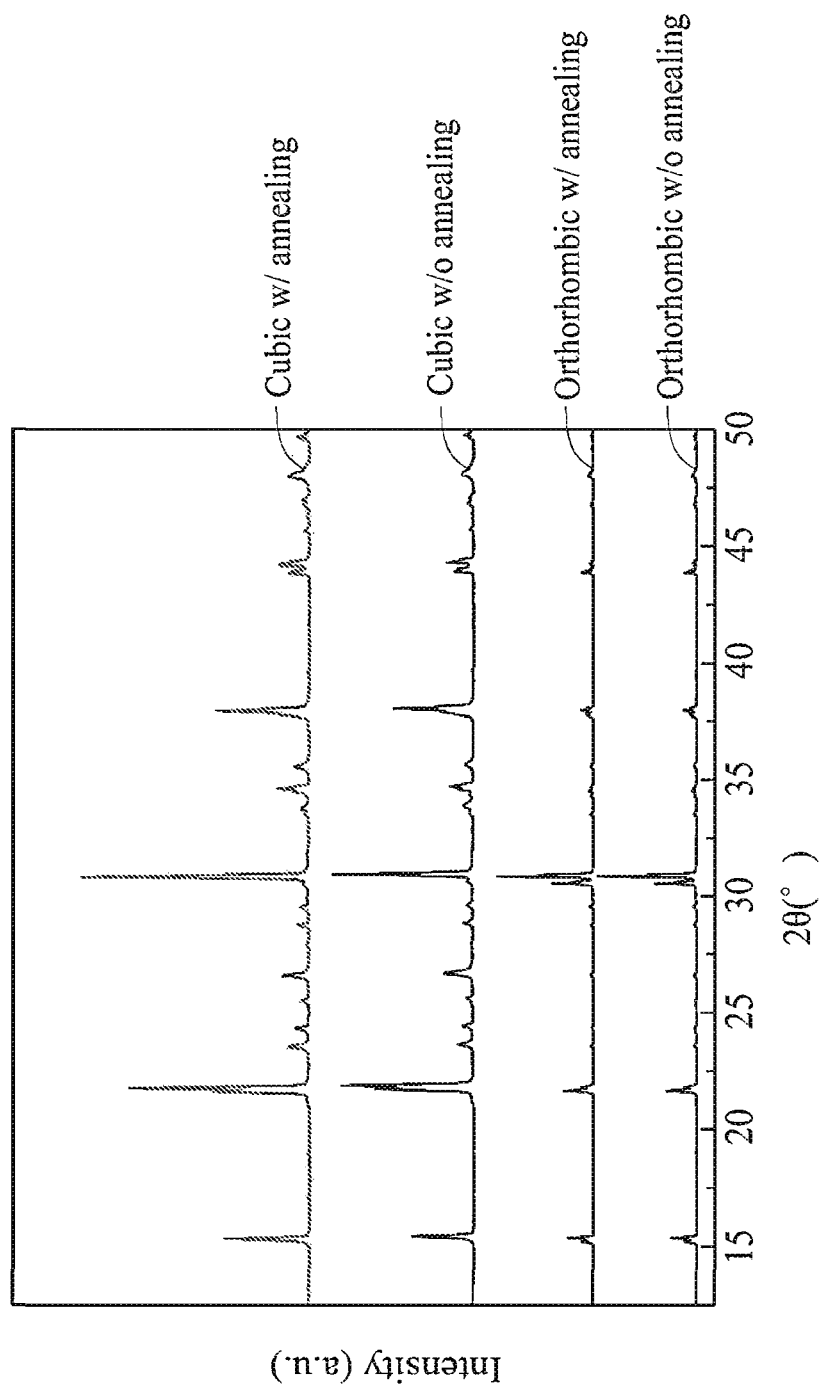
FIG. 25 is the XRD patterns of the perovskite thick film with or without an annealing treatment.

In addition, as shown in FIG. 25, no matter whether the perovskite thick film is subjected to an anneal treatment or not, the crystal phase will not be affected.

Example 14—Stability of X-Ray Detectors Comprising Perovskite Thick Films

X-ray detector: FTO/TiO$_2$/CsPbBr$_3$/Au (size is 1 cm$^2$) was prepared according to Example 6, wherein the content of CsPbBr$_3$ in the perovskite precursor solution was 0.2M, GBL:DMSO volume ratio was=8:2, the content of 18-crown-6 was 0.015 wt %, and the X-ray detector was encapsulated with UV resin and stored in an environment of 65° C./RH95% for 360 hours to observe the stability. The results are shown in FIG. 26.

Figure 26:
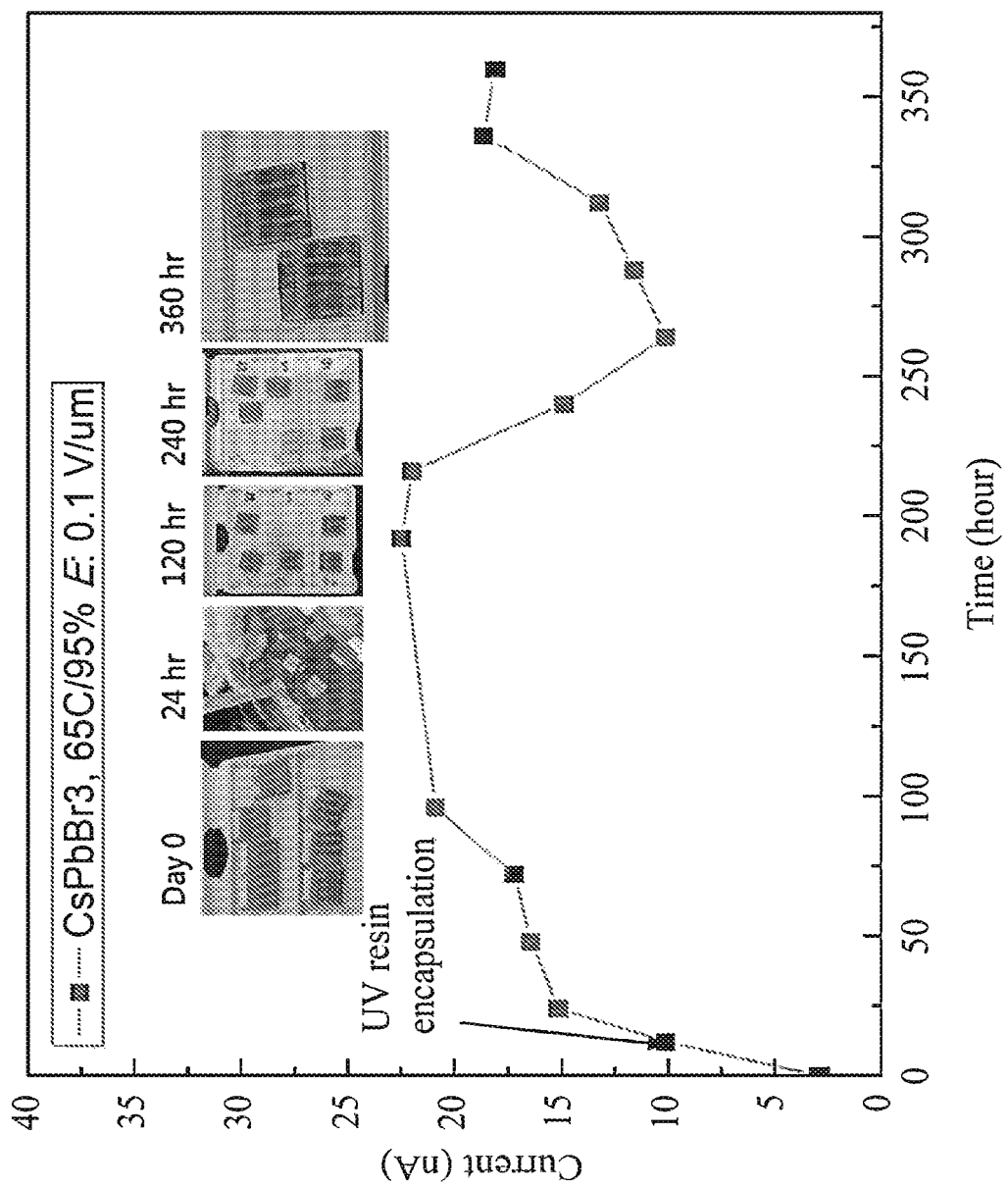
FIG. 26 is the stability test result of the X-ray detector of Example 14.

According to FIG. 26, the dark current density of the X-ray detector during storage can be between 10 to 25 nA/cm2 (E=0.1 V/µm), and the stability is excellent.

Example 15—Effects of Other Solvent Systems on X-Ray Detectors Comprising Perovskite Thick Films Prepare the perovskite precursor solution and prepare the perovskite thick film according to Example 1, whereas the difference was that the mixed solvent of GBL and DMSO in the perovskite precursor solution was replaced by a mixed solvent of GBL and DMAC, and GBL:DMAC volume ratio=8:2. Next, the X-ray detector FTO/TiO$_2$/CsPbBr$_3$/Au (size is 1 cm$^2$) was prepared according to Example 6. The dark current density of the X-ray detector was tested to be 5.1±0.06 nA/cm$^2$ (E=0.1 V/μm), which is at same level as the dark current density, 0.45±0.03 nA/cm$^2$ (E=0.1 V/μm), of the aforementioned perovskite thick film (210.28 μm) obtained using the solvent system of GBL:DMSO volume ratio=8:2.

Example 16—XPS Analysis of Perovskite Thick Films

Figure 27A:
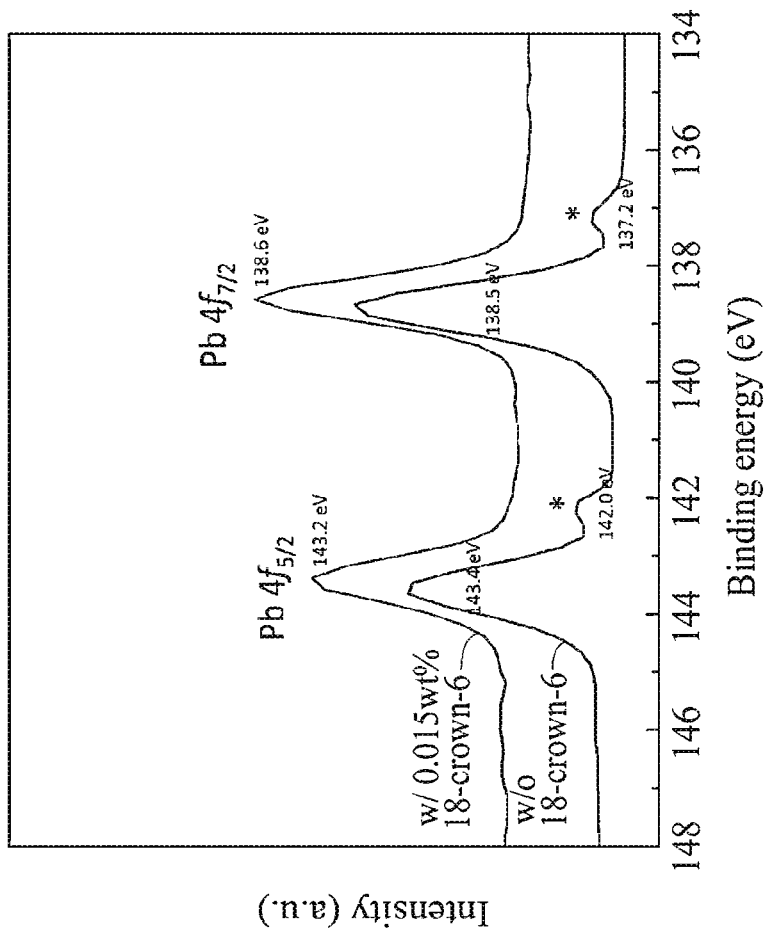
FIGS. 27A and 27B are the XPS analysis patterns of the perovskite thick film of Example 16.
Figure 27B:
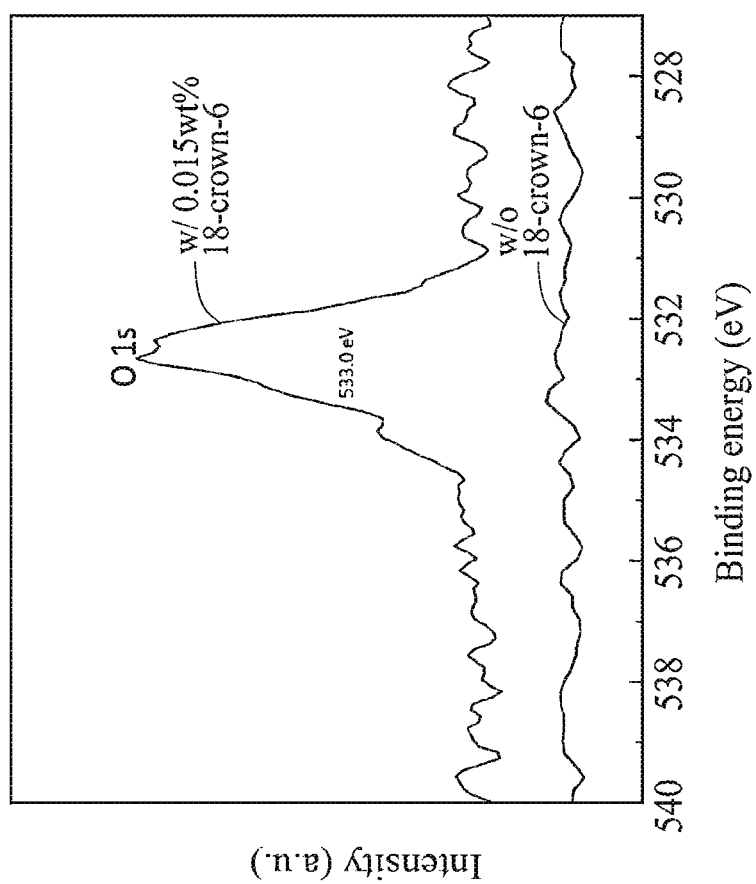

Prepare perovskite precursor solutions and prepare perovskite thick films according to Example 1, whereas the difference was that GBL:DMSO volume ratio was=8:2. XPS was used to observe the effect of adding 0.015 wt % of the crown ether compound 18-crown-6 on the surface layer and subsurface layer of the perovskite thick film, and the results are shown in FIGS. 27A and 27B. In FIG. 27A, the perovskite thick film without the crown ether compound exhibits lead signals at 142.0 eV and 137.2 eV, but these signals do not appear in the perovskite thick film with the crown ether compound added. It is speculated that the crown ether compound 18-crown-6 is combined with lead, so there is no lead signal. In FIG. 27B, since the crown ether compound 18-crown-6 has a C—O bond, the O 1 s signal at 533.0 eV can be observed in the graph of the perovskite thick film with the crown ether compound added; on the contrary, there is no such signal in the perovskite thick film without the crown ether compound. The surface layer is a layer with a depth of about 0 to about 10 nm from the surface of the perovskite film; and the subsurface layer is a layer with a depth of greater than about 10 to about 50 nm from the surface of the perovskite film.

Example 17—Surface Features of Other Perovskite Thick Films

Figure 28B:
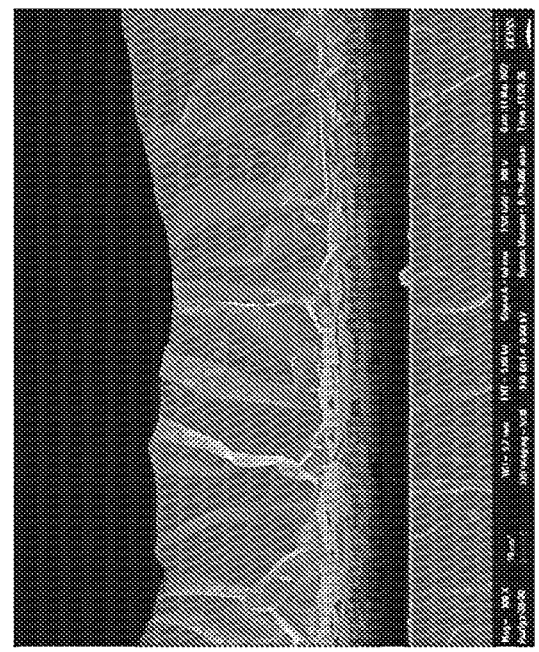
FIGS. 28A and 28B are SEM images of the perovskite thick film of Example 17.
Figure 28A:
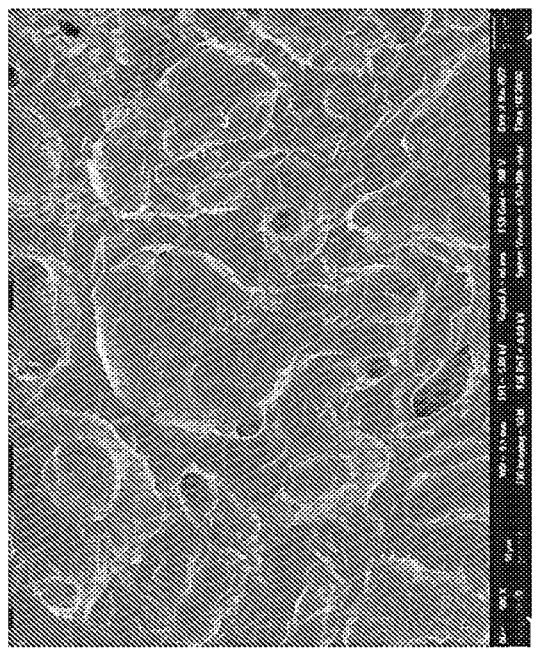

Prepare perovskite precursor solutions and prepare perovskite thick films according to, whereas the difference was that perovskite was replaced by MAPbI$_3$ or MAPbBr$_3$, GBL:DMSO volume ratio was=8:2, and the content of 18-crown-6 was 0.015 wt %. Observed by SEM, the MAPbI$_3$ perovskite thick film and the MAPbBr$_3$ perovskite thick film are shown in FIG. 28A and FIG. 28B, respectively, and both of which have a columnar crystal cubic crystal phase.

The embodiments disclosed herein use a non-toxic solvent system to prepare a perovskite precursor solution, which can reduce damage to the environment and operators.

In addition, The embodiments disclosed herein use a specific formulation of a perovskite precursor solution to prepare a perovskite thick film with a cubic crystal phase and larger crystal grains.

Further, combined with specific process steps and parameters, the crystal phase of the perovskite thick film can be further optimized, and thus a high-thickness perovskite thick film can be successfully produced to achieve sufficient absorption of X-rays.

The radiation detector using the perovskite thick film disclosed herein has very low dark current density and particularly excellent sensitivity.

It will be apparent to those skilled in the art that various modifications and variations can be made to the disclosed embodiments. It is intended that the specification and examples be considered as exemplary only, with a true scope of the disclosure being indicated by the following claims and their equivalents. Changes may be made in the details, especially in matters of shape, size, and arrangement of parts within the principles of the invention to the full extent indicated by the broad general meaning of the terms in which the appended claims are expressed.

The invention claimed is:

1. A radiation detector, comprising:
   a substrate;
   a pixel array formed on the substrate;
   a perovskite thick film with a cubic phase formed on the pixel array;
   a first electrode formed on the perovskite thick film and is opposite to the pixel array; and
   a readout circuit,
   wherein the perovskite thick film is formed by a perovskite having a chemical formula ABX$_3$;
   A is a monovalent cation selected from the group consisting of substituted or unsubstituted ammonium ions, substituted or unsubstituted amidine ions, Cs$^+$, Rb$^+$, Li$^+$ and Na$^+$;
   B is a divalent cation selected from the group consisting of Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Yb$^{2+}$, and Eu$^{2+}$; and
   X is a monovalent anion each independently selected from the group consisting of F$^-$, Cl$^-$, Br$^-$, I$^-$, SCN$^-$ and OCN$^-$,
   wherein the perovskite thick film comprises a crown ether compound, and the crown ether compound is at least one selected from the group consisting of 12-crown-4, 15-crown-5, 18-crown-6, 21-crown-7, 24-crown-8, and 30-crown-10.

2. The radiation detector of claim 1, wherein an X-ray diffraction analysis pattern of the perovskite thick film with a cubic crystal phase has 15.0°-15.6° (100) signal, a 21.3°-21.9° (110) signal, 30.3°-31.2° (200) signal, 37.6°-38.2° (211) signal, and 43.5°-44.1° (220) signal.

3. The radiation detector of claim 2, wherein the signals of (100), (110), (200), (211) and (220) are single peaks.

4. The radiation detector of claim 1, wherein the radiation detector is an X-ray sensor, a gamma ray sensor, or an X-ray and gamma ray sensor.

5. The radiation detector of claim 4, wherein a dark current density of the radiation detector is between 0.1 and 25 nA/cm$^2$ (E=0.1 V/μm).

6. The radiation detector of claim 1, wherein a thickness of the perovskite thick film is 200 μm or above.

7. The radiation detector of claim 1, wherein a surface layer and a subsurface layer of the perovskite thick film do not contain lead.

8. The radiation detector of claim 7, wherein the surface layer is a layer with a depth of 0 to 10 nm from the surface of the perovskite thick film; the subsurface layer is a layer with a depth greater than 10 to 50 nm from the surface of the perovskite thick film.

9. The radiation detector of claim 1, wherein an XPS analysis pattern of a surface layer and a subsurface layer of the perovskite thick film has a C—O bonding signal at 533.0 eV.

10. The radiation detector of claim 1, wherein the pixel array comprises a charge coupled device (CCD), a complementary metal oxide semiconductor (CMOS) or a thin film transistor (TFT).

11. A method for preparing a perovskite thick film, comprising:
   a) providing a perovskite precursor solution;
   b) spraying the perovskite precursor solution on a substrate, and heating the substrate to form a perovskite film;
   c) repeating b) to form a perovskite thick film;
   d) surface treating the perovskite thick film with a surface treatment solvent having the same composition as the solvent in the perovskite precursor solution;
   e) annealing the perovskite thick film; and
   f) slowly cooling the perovskite thick film,
   wherein the perovskite thick film is formed by a perovskite having a chemical formula $ABX_3$;
   A is a monovalent cation selected from the group consisting of substituted or unsubstituted ammonium ions, substituted or unsubstituted amidine ions, $Cs^+$, $Rb^+$, $Li^+$ and $Na^+$;
   B is a divalent cation selected from a group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$; and
   X is a monovalent anion each independently selected from the group consisting of $F^-$, $Cl^-$, $Br^-$, $I^-$, $SCN^-$ and $OCN^-$,
   wherein the perovskite film comprises a crown ether compound, and the crown ether compound is at least one selected from the group consisting of 12-crown-4, 15-crown-5, 18-crown-6, 21-crown-7, 24-crown-8, and 30-crown-10.

12. The method of claim 11, wherein the perovskite precursor solution comprises a perovskite precursor salt, the crown ether compound, and the solvent.

13. The method of claim 12, wherein the perovskite precursor salt comprises a compound of the chemical formula AX and a compound of the chemical formula $BX'_2$,
   A is a monovalent cation selected from the group consisting of substituted or unsubstituted ammonium ions, substituted or unsubstituted amidine ions, $Cs^+$, $Rb^+$, $Li^+$ and $Na^+$;
   B is a divalent cation selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$;
   X and X' are monovalent anions each independently selected from the group consisting of $F^-$, $Cl^-$, $Br^-$, $I^-$, $SCN^-$ and $OCN^-$;
   the crown ether compound is at least one selected from the group consisting of 12-crown-4, 15-crown-5, 18-crown-6, 21-crown-7, 24-crown-8, and 30-crown-10; and
   the solvent is at least one selected from the group consisting of dimethylsulfoxide, N—N dimethylformamide, γ-butyrolactone, and N,N-dimethylacetamide.

14. The method of claim 13, wherein the solvent is γ-butyrolactone and dimethylsulfoxide, and a volume ratio of the γ-butyrolactone and the dimethylsulfoxide is 70:30 to 85:15.

15. The method of claim 12, wherein the perovskite precursor solution contains 0.01 to 0.02 wt % of the crown ether compound.

16. The method of claim 11, wherein the perovskite thick film comprises $CsPbBr_3$ perovskite and 18-crown-6.

17. The method of claim 11, wherein the surface treatment solvent is γ-butyrolactone and dimethylsulfoxide, and a volume ratio of the γ-butyrolactone and the dimethylsulfoxide is 70:30 to 85:15.

18. The method of claim 11, wherein the heating of the substrate in b) and c) is carried out in a staged heating manner.

19. The method of claim 11, wherein a time difference (ΔT) of the repeated spraying at the same position in c) is 100 seconds to less than 350 seconds.

20. The method of claim 11, wherein a time difference (ΔT) of the repeated spraying at the same position in c) is 150 seconds to 300 seconds.

21. The method of claim 11, wherein an annealing temperature in e) is 150° C. to 190° C., and an annealing time is 1 to 10 hours.

22. The method of claim 11, wherein a slow cooling rate in f) is 0.1° C./min to 1° C./min.

23. The method of claim 11, wherein a thickness of the perovskite thick film is greater than 200 μm.

24. The method of claim 11, wherein a thickness of the perovskite thick film is between 200 and 1000 μm.

* * * * *